US010880040B1

(12) United States Patent
Danilov et al.

(10) Patent No.: US 10,880,040 B1
(45) Date of Patent: Dec. 29, 2020

(54) SCALE-OUT DISTRIBUTED ERASURE CODING

(71) Applicant: EMC IP Holding Company LLC, Hopkinton, MA (US)

(72) Inventors: Mikhail Danilov, Saint Petersburg (RU); Konstantin Buinov, Prague (CZ)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 171 days.

(21) Appl. No.: 15/791,390

(22) Filed: Oct. 23, 2017

(51) Int. Cl.
*H03M 13/00* (2006.01)
*H04L 1/00* (2006.01)
*G06F 9/46* (2006.01)
*H04L 29/08* (2006.01)

(52) U.S. Cl.
CPC ............ *H04L 1/0082* (2013.01); *G06F 9/463* (2013.01); *H04L 1/0072* (2013.01); *H04L 67/1097* (2013.01)

(58) Field of Classification Search
CPC ..... H04L 1/0082; H04L 1/0072; H04L 67/97; H04L 1/1097; G06F 9/463
See application file for complete search history.

(56) References Cited

U.S. PATENT DOCUMENTS

| | | | |
|---|---|---|---|
| 5,675,802 A | 10/1997 | Allen et al. | |
| 5,805,788 A | 9/1998 | Johnson | |
| 5,950,225 A | 9/1999 | Kleiman | |
| 6,502,243 B1 | 12/2002 | Thomas | |
| 7,389,393 B1 | 6/2008 | Karr et al. | |
| 7,680,875 B1 | 3/2010 | Shopiro et al. | |
| 7,721,044 B1 | 5/2010 | Chatterjee et al. | |
| 8,125,406 B1 | 2/2012 | Jensen et al. | |
| 8,261,033 B1 | 9/2012 | Slik et al. | |
| 8,370,542 B2 | 2/2013 | Lu et al. | |

(Continued)

OTHER PUBLICATIONS

J. Huang, X. Liang, X. Qin, P. Xie and C. Xie, "Scale-RS: An Efficient Scaling Scheme for RS-Coded Storage Clusters," in IEEE Transactions on Parallel and Distributed Systems, vol. 26, No. 6, pp. 1704-1717, Jun. 1, 2015.*

(Continued)

*Primary Examiner* — Albert Decady
*Assistant Examiner* — Enamul M Kabir
(74) *Attorney, Agent, or Firm* — Amin, Turocy & Watson, LLP

(57) ABSTRACT

Overhead associated with data re-protection during scaling out and/or scaling up of a distributed cloud storage system can be reduced. A coding matrix that is to be utilized for erasure coding in a potential final configuration of the distributed cloud storage can be determined. During initial data protection, a portion of the coding matrix can be utilized to determine coding chunks for protecting data chunks stored within different geographical zones of the distributed cloud storage system. When additional zones are added to the distributed cloud storage system, a larger portion of the coding matrix can be utilized to erasure code the new configuration and accordingly, the existing coding chunks are considered as partially complete. Further, the partially complete coding chunks can be combined with data chunks stored within the newly added zones and coefficients of the larger portion of the coding matrix to generate complete coding chunks.

20 Claims, 12 Drawing Sheets

(56) References Cited

U.S. PATENT DOCUMENTS

| | | |
|---|---|---|
| 8,479,037 B1 | 7/2013 | Chatterjee et al. |
| 8,495,465 B1 | 7/2013 | Anholt et al. |
| 8,751,740 B1 | 6/2014 | De Forest et al. |
| 8,799,746 B2 | 8/2014 | Baker et al. |
| 8,832,234 B1 | 9/2014 | Brooker et al. |
| 8,856,619 B1 | 10/2014 | Cypher |
| 8,972,478 B1 | 3/2015 | Storer et al. |
| 9,003,086 B1 | 4/2015 | Schuller et al. |
| 9,063,838 B1 | 6/2015 | Boyle et al. |
| 9,208,009 B2* | 12/2015 | Resch ............... G06F 11/1076 |
| 9,244,761 B2 | 1/2016 | Yekhanin et al. |
| 9,268,783 B1 | 2/2016 | Shilane et al. |
| 9,274,903 B1 | 3/2016 | Garlapati et al. |
| 9,280,430 B2 | 3/2016 | Sarfare et al. |
| 9,405,483 B1 | 8/2016 | Wei et al. |
| 9,477,682 B1 | 10/2016 | Bent et al. |
| 9,641,615 B1 | 5/2017 | Robins et al. |
| 9,747,057 B1 | 8/2017 | Ramani et al. |
| 9,864,527 B1 | 1/2018 | Srivastav et al. |
| 10,055,145 B1 | 8/2018 | Danilov et al. |
| 10,127,234 B1 | 11/2018 | Krishnan et al. |
| 10,216,770 B1 | 2/2019 | Kulesza et al. |
| 10,242,022 B1 | 3/2019 | Jain et al. |
| 10,282,262 B2 | 5/2019 | Panara et al. |
| 10,361,810 B2 | 7/2019 | Myung et al. |
| 10,496,330 B1 | 12/2019 | Bemat et al. |
| 10,503,611 B1 | 12/2019 | Srivastav et al. |
| 10,613,780 B1 | 4/2020 | Naeni et al. |
| 10,733,053 B1 | 8/2020 | Miller et al. |
| 10,797,863 B2 | 10/2020 | Chen et al. |
| 2002/0166026 A1 | 11/2002 | Ulrich et al. |
| 2005/0080982 A1 | 4/2005 | Vasilevsky et al. |
| 2005/0088318 A1 | 4/2005 | Liu et al. |
| 2005/0108775 A1 | 5/2005 | Bachar et al. |
| 2005/0140529 A1 | 6/2005 | Choi et al. |
| 2005/0234941 A1 | 10/2005 | Watanabe |
| 2006/0047896 A1 | 3/2006 | Nguyen et al. |
| 2006/0075007 A1 | 4/2006 | Anderson et al. |
| 2006/0143508 A1 | 6/2006 | Mochizuki et al. |
| 2006/0265211 A1 | 11/2006 | Canniff et al. |
| 2007/0076321 A1 | 4/2007 | Takahashi et al. |
| 2007/0239759 A1 | 10/2007 | Shen et al. |
| 2007/0250674 A1 | 10/2007 | Findberg et al. |
| 2008/0222480 A1* | 9/2008 | Huang ............... H03M 13/1191 714/752 |
| 2008/0222481 A1* | 9/2008 | Huang ............... H03M 13/1191 714/752 |
| 2008/0244353 A1* | 10/2008 | Dholakia ............ H03M 13/036 714/752 |
| 2008/0320061 A1 | 12/2008 | Aszmann et al. |
| 2009/0070771 A1 | 3/2009 | Yuyitung et al. |
| 2009/0113034 A1 | 4/2009 | Krishnappa et al. |
| 2009/0172464 A1 | 7/2009 | Byrne et al. |
| 2009/0183056 A1 | 7/2009 | Aston |
| 2009/0204959 A1 | 8/2009 | Anand et al. |
| 2009/0240880 A1 | 9/2009 | Kawaguchi |
| 2009/0259882 A1 | 10/2009 | Shellhamer |
| 2010/0031060 A1 | 2/2010 | Chew et al. |
| 2010/0218037 A1* | 8/2010 | Swartz ............... G06F 16/00 714/6.12 |
| 2010/0293348 A1 | 11/2010 | Ye et al. |
| 2010/0332748 A1 | 12/2010 | Van der Goot et al. |
| 2011/0029836 A1* | 2/2011 | Dhuse ............... G06F 11/1076 714/752 |
| 2011/0106972 A1* | 5/2011 | Grube ............... G06F 13/1668 709/238 |
| 2011/0107165 A1 | 5/2011 | Resch et al. |
| 2011/0138148 A1 | 6/2011 | Friedman et al. |
| 2011/0161712 A1 | 6/2011 | Athalye et al. |
| 2011/0196833 A1 | 8/2011 | Drobychev et al. |
| 2011/0246503 A1 | 10/2011 | Bender et al. |
| 2011/0292054 A1 | 12/2011 | Boker et al. |
| 2012/0023291 A1 | 1/2012 | Zeng et al. |
| 2012/0096214 A1 | 4/2012 | Lu et al. |
| 2012/0191675 A1 | 7/2012 | Kim et al. |
| 2012/0191901 A1 | 7/2012 | Norair |
| 2012/0204077 A1 | 8/2012 | D'Abreu et al. |
| 2012/0233117 A1 | 9/2012 | Holt et al. |
| 2012/0311395 A1* | 12/2012 | Leggette ............ G06F 12/1408 714/752 |
| 2012/0317234 A1 | 12/2012 | Bohrer et al. |
| 2012/0321052 A1 | 12/2012 | Morrill et al. |
| 2013/0047187 A1 | 2/2013 | Frazier et al. |
| 2013/0054822 A1 | 2/2013 | Mordani et al. |
| 2013/0067159 A1 | 3/2013 | Mehra |
| 2013/0067187 A1 | 3/2013 | Moss et al. |
| 2013/0088501 A1 | 4/2013 | Fell |
| 2013/0097470 A1 | 4/2013 | Hwang et al. |
| 2013/0238932 A1* | 9/2013 | Resch ................ G06F 21/64 714/20 |
| 2013/0246876 A1 | 9/2013 | Manssour et al. |
| 2013/0290482 A1 | 10/2013 | Leggette |
| 2013/0305365 A1 | 11/2013 | Rubin et al. |
| 2014/0040417 A1 | 2/2014 | Galdwin et al. |
| 2014/0064048 A1 | 3/2014 | Cohen et al. |
| 2014/0115182 A1 | 4/2014 | Sabaa et al. |
| 2014/0164430 A1 | 6/2014 | Hadjieleftheriou et al. |
| 2014/0164694 A1* | 6/2014 | Storer ............... G06F 11/1092 711/114 |
| 2014/0250450 A1 | 9/2014 | Yu et al. |
| 2014/0280375 A1 | 9/2014 | Rawson et al. |
| 2014/0281804 A1* | 9/2014 | Resch ............... G06F 8/65 714/763 |
| 2014/0297955 A1 | 10/2014 | Yamazaki et al. |
| 2014/0331100 A1* | 11/2014 | Dhuse ............... G06F 21/64 714/752 |
| 2014/0358972 A1 | 12/2014 | Guarrieri et al. |
| 2014/0359244 A1 | 12/2014 | Chambliss et al. |
| 2014/0380088 A1 | 12/2014 | Bennett et al. |
| 2014/0380125 A1 | 12/2014 | Calder et al. |
| 2015/0006846 A1 | 1/2015 | Youngworth |
| 2015/0074065 A1 | 3/2015 | Christ et al. |
| 2015/0112951 A1 | 4/2015 | Narayanamurthy et al. |
| 2015/0134626 A1 | 5/2015 | Theimer et al. |
| 2015/0142863 A1* | 5/2015 | Yuen ............... H03M 13/13 707/827 |
| 2015/0178007 A1 | 6/2015 | Moisa et al. |
| 2015/0186043 A1 | 7/2015 | Kesselman et al. |
| 2015/0303949 A1* | 10/2015 | Jafarkhani ......... H03M 13/617 714/764 |
| 2015/0331766 A1 | 11/2015 | Sarfare et al. |
| 2015/0370656 A1 | 12/2015 | Tsafrir et al. |
| 2016/0011935 A1 | 1/2016 | Luby |
| 2016/0011936 A1 | 1/2016 | Luby |
| 2016/0055054 A1 | 2/2016 | Patterson, III et al. |
| 2016/0162378 A1 | 6/2016 | Garlapati et al. |
| 2016/0169692 A1 | 6/2016 | Gupta |
| 2016/0170668 A1 | 6/2016 | Mehra |
| 2016/0217104 A1 | 7/2016 | Kamble et al. |
| 2016/0232055 A1 | 8/2016 | Vairavanathan et al. |
| 2016/0253400 A1 | 9/2016 | McAlister et al. |
| 2016/0328295 A1 | 11/2016 | Baptist et al. |
| 2016/0357649 A1 | 12/2016 | Karrotu et al. |
| 2016/0371145 A1 | 12/2016 | Akutsu et al. |
| 2016/0378624 A1* | 12/2016 | Jenkins, Jr. ........ G06F 11/1076 714/6.3 |
| 2016/0380650 A1 | 12/2016 | Calder et al. |
| 2017/0003880 A1 | 1/2017 | Fisher et al. |
| 2017/0004044 A1 | 1/2017 | Tormasov et al. |
| 2017/0017671 A1 | 1/2017 | Baptist et al. |
| 2017/0031945 A1 | 2/2017 | Sarab et al. |
| 2017/0097875 A1 | 4/2017 | Jess et al. |
| 2017/0102993 A1 | 4/2017 | Hu et al. |
| 2017/0116088 A1 | 4/2017 | Anami et al. |
| 2017/0187398 A1* | 6/2017 | Trusov ............. H03M 13/2909 |
| 2017/0187766 A1* | 6/2017 | Zheng ............... H04L 65/4076 |
| 2017/0206025 A1 | 7/2017 | Viswanathan |
| 2017/0206135 A1 | 7/2017 | Zeng |
| 2017/0212680 A1 | 7/2017 | Waghulde |
| 2017/0212845 A1 | 7/2017 | Conway |
| 2017/0235507 A1 | 8/2017 | Sinha et al. |
| 2017/0262187 A1 | 9/2017 | Manzanares et al. |

(56) References Cited

U.S. PATENT DOCUMENTS

| | | | |
|---|---|---|---|
| 2017/0268900 A1 | 9/2017 | Nicolaas et al. | |
| 2017/0286516 A1 | 10/2017 | Horowitz et al. | |
| 2017/0344285 A1 | 11/2017 | Choi et al. | |
| 2018/0052744 A1 | 2/2018 | Chen et al. | |
| 2018/0063213 A1 | 3/2018 | Bevilacqua-Linn et al. | |
| 2018/0074881 A1 | 3/2018 | Burden | |
| 2018/0121286 A1* | 5/2018 | Sipos | G06F 11/1076 |
| 2018/0129417 A1 | 5/2018 | Sivasubramanian et al. | |
| 2018/0181324 A1* | 6/2018 | Danilov | G06F 3/0608 |
| 2018/0181612 A1 | 6/2018 | Danilov et al. | |
| 2018/0246668 A1 | 8/2018 | Sakashita et al. | |
| 2018/0267856 A1 | 9/2018 | Hayasaka et al. | |
| 2018/0267985 A1 | 9/2018 | Badey et al. | |
| 2018/0306600 A1 | 10/2018 | Nicolaas et al. | |
| 2018/0307560 A1 | 10/2018 | Vishnumolakala et al. | |
| 2018/0341662 A1 | 11/2018 | He | |
| 2019/0028179 A1 | 1/2019 | Kalhan | |
| 2019/0034084 A1 | 1/2019 | Nagarajan et al. | |
| 2019/0043201 A1 | 2/2019 | Strong et al. | |
| 2019/0043351 A1 | 2/2019 | Yang et al. | |
| 2019/0050301 A1 | 2/2019 | Juniwal et al. | |
| 2019/0065092 A1 | 2/2019 | Shah et al. | |
| 2019/0065310 A1 | 2/2019 | Rozas | |
| 2019/0114223 A1 | 4/2019 | Pydipaty et al. | |
| 2019/0205437 A1 | 7/2019 | Larson et al. | |
| 2019/0215017 A1 | 7/2019 | Danilov et al. | |
| 2019/0220207 A1 | 7/2019 | Lingarajappa | |
| 2019/0384500 A1 | 12/2019 | Danilov et al. | |
| 2019/0386683 A1 | 12/2019 | Danilov et al. | |
| 2020/0026810 A1 | 1/2020 | Subramaniam et al. | |
| 2020/0050510 A1 | 2/2020 | Chien et al. | |
| 2020/0104377 A1 | 4/2020 | Earnesty, Jr. et al. | |
| 2020/0117556 A1 | 4/2020 | Zou et al. | |

OTHER PUBLICATIONS

Notice of Allowance received for U.S. Appl. No. 15/862,547 dated Mar. 29, 2019 27 pages.

Non-Final Office Action received for U.S. Appl. No. 15/792,714 dated Apr. 4, 2019, 20 pages.

Final Office Action received for U.S. Appl. No. 15/792,714 dated Sep. 12, 2019, 43 pages.

Wikipedia "Garbage Collection", URL: https://en.wikipedia.org/wiki/Garbage_collection_(computer science)#Availability (Year: 2017) retrieved using the WayBackMachine, Sep. 8, 2017, 8 pages.

Wikipedia "Erasure code", URL: https://web.archive.org/web/20170908171158/https://en.wikipedia.org/wiki/Erasure_code (Year: 2017), retrieved using the WayBackMachine, Sep. 8, 2017, 5 pages.

Wikipedia "Front and back ends" URL: https://en.wikipedia.org/wiki/Front_and_back_ends (Year:2019), Sep. 6, 2019, 4 pages.

Notice of Allowance received for U.S. Appl. No. 15/792,714 dated Nov. 8, 2019, 31 pages.

Non-Final Office Action received for U.S. Appl. No. 16/457,615 dated Jul. 20, 2020, 34 pages.

Non-Final Office Action received for U.S. Appl. No. 16/209,185 dated Jun. 18, 2020, 22 pages.

Martin Hosken, Developing a Hyper-Converged Storage Strategy for VMware vCloud Director with VMware vSAN, Jan. 2018 (Year: 2018).

Non-Final Office Action received for U.S. Appl. No. 16/261,549 dated Apr. 15, 2020, 22 pages.

Non-Final Office Action received for U.S. Appl. No. 16/374,726 dated Jun. 2, 2020, 47 pages.

Natarajan, RAID 0, RAID 1, RAID 5, RAID 10 Explained with Diagrams, Aug. 10, 2010, thegeekstuff.com (18 pages).

Non-Final Office Action received for U.S. Appl. No. 16/177,285 dated Jul. 22, 2020, 31 pages.

Non-Final Office Action received for U.S. Appl. No. 16/261,547 dated Sep. 3, 2020, 26 pages.

Non-Final Office Action received for U.S. Appl. No. 16/261,548 dated Aug. 21, 2020, 42 pages.

Notice of Allowance received for U.S. Appl. No. 16/261,549 dated Jul. 17, 2020, 40 pages.

Qiang et al., "Dynamics Process of Long-running Allocation/Collection in Linear Storage Space", International conference on Networking, Architecture, and Storage (NAS 2007), Guilin, 2007, pp. 209-216.

Non-Final Office Action received for U.S. Appl. No. 16/374,725 dated Aug. 19, 2020, 50 pages.

Non-Final Office Action received for U.S. Appl. No. 16/511,161 dated Jul. 10, 2020, 24 pages.

Non-Final Office Action received for U.S. Appl. No. 15/651,504 dated Mar. 21, 2019, 10 pages.

Non-Final Office Action received for U.S. Appl. No. 15/662,273 dated Nov. 16, 2018, 19 pages.

Final Office Action received for U.S. Appl. No. 15/662,273 dated May 15, 2019, 33 pages.

Non-Final Office Action received for U.S. Appl. No. 15/965,479 dated Apr. 15, 2019, 21 pages.

Non-Final Office Action received for U.S. Appl. No. 15/794,950 dated Jul. 9, 2019, 29 pages.

Final Office Action received for U.S. Appl. No. 15/651,504 dated Sep. 18, 2019, 15 pages.

Non-Final Office Action received for U.S. Appl. No. 15/952,179 dated Sep. 10, 2019, 42 pages.

Wikipedia, "Standard Raid Levels—RAID 6, URL: https://en.wikipedia.org/wiki/Standard_RAID_levels#RAID_6", Oct. 18, 2019, 11 pages.

Non-Final Office Action received for U.S. Appl. No. 15/656,382 dated Nov. 1, 2019, 47 pages.

Final Office Action received for U.S. Appl. No. 15/952,179 dated Nov. 26, 2019, 53 pages.

Non Final Office Action received for U.S. Appl. No. 16/024,314 dated Nov. 25, 2019, 42 pages.

Non- Final Office Action received for U.S. Appl. No. 16/177,278 dated Dec. 2, 2019, 55 pages.

Non-Final Office Action received for U.S. Appl. No. 15/651,504 dated Dec. 31, 2019, 18 pages.

Non-Final Office Action received for U.S. Appl. No. 16/010,246 dated Dec. 5, 2019, 67 pages.

Stonebreaker et al. "Distributed RAID—A New Multiple Copy Algorithm.", IEEE ICDE, 1990, pp. 430-437.

Muralidhar et al. "f4: Facebook's Warm BLOB Storage System", USENIX. OSDI, Oct. 2014, pp. 383-398.

Final Office Action dated Feb. 12, 2020 for U.S. Appl. No. 16/024,314, 29 pages.

Non-Final Office Action received for U.S. Appl. No. 16/010,255 dated Jan. 9, 2020, 31 pages.

Office Action dated Feb. 5, 2020 for U.S. Appl. No. 16/261,551, 30 pages.

Non-Final Office Action received for U.S. Appl. No. 16/228,612 dated Feb. 27, 2020, 49 pages.

Final Office Action received for U.S. Appl. No. 16/010,246 dated Mar. 16, 2020, 33 pages.

Final Office Action received for U.S. Appl. No. 15/656,382 dated Apr. 6, 2020, 31 pages.

Non-Final Office Action received for U.S. Appl. No. 15/582,167 dated Sep. 7, 2018, 19 pages.

Non-Final Office Action received for U.S. Appl. No. 15/952,179 dated Apr. 20, 2020, 68 pages.

Notice of Allowance received for U.S. Appl. No. 16/240,193, dated May 4, 2020, 46 pages.

Final Office Action received for U.S. Appl. No. 16/177,278, dated May 11, 2020, 53 pages.

Non-Final Office Action received for U.S. Appl. No. 16/231,018 dated May 8, 2020, 78 pages.

Notice of Allowance dated May 11, 2020 for U.S. Appl. No. 16/240,193, 24 pages.

Non-Final Office Action received for U.S. Appl. No. 16/228,624 dated Jun. 24, 2020, 65 pages.

Non-Final Office Action received for U.S. Appl. No. 16/240,272 dated Jun. 29, 2020, 64 pages.

Non-Final Office Action received for U.S. Appl. No. 16/228,612 dated Jun. 29, 2020, 62 pages.

(56) References Cited

OTHER PUBLICATIONS

Final Office Action received for U.S. Appl. No. 16/010,255 dated Jul. 23, 2020, 36 pages.
Office Action received for U.S. Appl. No. 16/010,246 dated Jul. 27, 2020 36 pages.
Office Action received for U.S. Appl. No. 16/177,278, dated Aug. 21, 2020, 53 pages.
Office Action received for U.S. Appl. No. 16/179,486, dated Aug. 13, 2020, 64 pages.
Guo et al., "GeoScale: Providing Geo-Elasticity in Distributed Clouds" 2016 IEEE International Conference on Cloud Engineering, 4 pages.
Guo et al., "Providing Geo-Elasticity in Geographically Distributed Clouds". ACM Transactions on Internet Technology, vol. 18, No. 3, Article 38. Apr. 2018. 27 pages.
Office Action received for U.S. Appl. No. 16/254,073, dated Aug. 18, 2020, 62 pages.
Non-Final Office Action received for U.S. Appl. No. 16/526,142 dated Oct. 15, 2020, 21 pages.
Notice of Allowance received U.S. Appl. No. 16/228,612 date Oct. 20, 2020, 84 pages.
Zhou, et al. "Fast Erasure Coding for Data Storage: A Comprehensive Study of the Acceleration Techniques" Proceedings of the 17th Usenix Conference on File and Storage Technologies (FAST '19), [https://www.usenix.org/conference/fast19/presentation/zhou], Feb. 2019, Boston, MA, USA. 14 pages.
Office Action for U.S. Appl. No. 16/010,255 dated Oct. 29, 2020, 65 pages.
Office Action for U.S. Appl. No. 16/240,272 dated Oct. 27, 2020, 42 pages.
Office Action for U.S. Appl. No. 16/399,902 dated Oct. 28, 2020, 83 pages.

\* cited by examiner

SCALE-OUT DISTRIBUTED ERASURE CODING

TECHNICAL FIELD

The subject disclosure relates generally to a system and method for scale-out distributed erasure coding.

BACKGROUND

The large increase in amount of data generated by digital systems has created a new set of challenges for data storage environments. Traditional storage area network (SAN) and/or network-attached storage (NAS) architectures have not been designed to support data storage or protection at large multi-petabyte capacity levels. Object storage technology can be utilized to meet these requirements. With object storage technology, organizations can not only keep up with rising capacity levels, but can also store these new capacity levels at a manageable cost point.

Typically, a scale-out, cluster-based, shared-nothing object storage that employs a microservices architecture pattern, for example, an Elastic Cloud Storage (ECS) can be utilized as a storage environment for a new generation of workloads. ECS is a cloud-based object storage appliance, wherein the storage control software and the physical magnetic disk media are combined as an integrated system with no access to the storage media other than through the ECS. ECS is an append-only virtual storage platform that protects content from being erased or overwritten for a specified retention period. ECS does not employ traditional data protection schemes like mirroring or parity protection. Instead, ECS utilizes erasure coding for data protection, wherein a data chunk is broken into fragments, expanded, and encoded with redundant data pieces and then stored across a set of different locations or storage media.

The above-described background relating to storage systems is merely intended to provide a contextual overview of some current issues, and is not intended to be exhaustive. Other contextual information may become further apparent upon review of the following detailed description.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its sole purpose is to present some concepts of the specification in a simplified form as a prelude to the more detailed description that is presented in this disclosure.

Example systems and methods disclosed herein relate to scale-out erasure coding for data protection in a scale-out/scale-up cloud-based storage systems. In one example embodiment, a system is disclosed that comprises a processor and a memory that stores executable instructions that, when executed by the processor, facilitate performance of operations. Moreover, the operations comprise determining coding matrix data indicative of a first coding matrix that is to be utilized for erasure coding first data chunks stored within a distributed storage system that comprises a first number of zones, wherein the first coding matrix comprises a portion of a second coding matrix that is to be utilized for erasure coding second data chunks stored within a scaled-out version of the distributed storage system that comprises a second number of zones. Further, the operations comprise based on the coding matrix data, determining coding chunks that are employable for recovery of at least one of the first data chunks during a dual zone failure.

Another example embodiment of the specification relates to a method that comprises determining, by a system comprising a processor, coding matrix data indicative of a first coding matrix that is to be utilized for erasure coding first data chunks stored within a distributed storage system comprising a first number of zones, wherein the first coding matrix is a portion of a second coding matrix that is to be utilized for erasure coding second data chunks stored within a scaled-out version of the distributed storage system comprising a second number of zones. According to an aspect, the method further comprises based on the coding matrix data, determining coding chunks that are employable for recovery of at least one of the first data chunks during a dual zone failure.

Another example embodiment of the specification relates to a computer-readable storage medium comprising instructions that, in response to execution, cause a system comprising a processor to perform operations, comprising determining a coding matrix associated with a first erasure coding protection scheme that is to be applied to an expanded version of a distributed storage system; based on a second erasure coding protection scheme that is to be applied to the distributed storage system prior to expansion, selecting a portion of the coding matrix; and employing the portion of the coding matrix to generate coding chunks for data chunks stored within the distributed storage system.

The following description and the drawings set forth certain illustrative aspects of the specification. These aspects are indicative a few of the various ways in which the principles of the specification may be employed. Other advantages and novel features of the specification will become apparent from the detailed description of the specification when considered in conjunction with the drawings.

DETAILED DESCRIPTION

Figure 1:
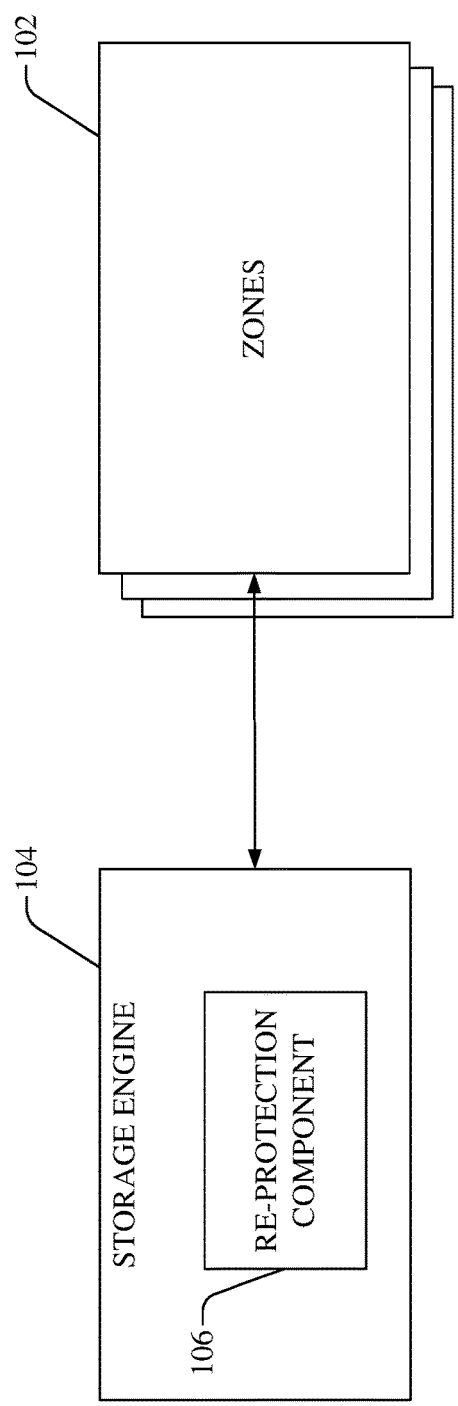
FIG. 1 illustrates an example system that facilitates data protection during expansion of a distributed cloud storage system.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

The term "cloud" as used herein can refer to a cluster of nodes (e.g., set of network servers), for example, within a distributed storage system, that are communicatively and/or operatively coupled to each other, and that host a set of applications utilized for servicing user requests. In general, the cloud computing resources can communicate with user devices via most any wired and/or wireless communication network to provide access to services that are based in the cloud and not stored locally (e.g., on the user device). A typical cloud-computing environment can include multiple layers, aggregated together, that interact with each other to provide resources for end-users.

Example systems and methods disclosed herein, in one or more embodiments, relate to a scale-out elastic cloud storage (ECS) platform that can combine the cost advantages of commodity infrastructure with the reliability, availability and serviceability of traditional arrays. In one aspect, the ECS platform can comprise a cluster of nodes (also referred to as "cluster" herein) that delivers scalable and simple public cloud services with the reliability and/or control of a private-cloud infrastructure. Moreover, the ECS platform comprises a scale-out, cluster-based, shared-nothing object storage, which employs a microservices architecture pattern. The ECS platform can support storage, manipulation, and/or analysis of unstructured data on a massive scale on commodity hardware. As an example, ECS can support mobile, cloud, big data, and/or social networking applications. ECS can be deployed as a turnkey storage appliance or as a software product that can be installed on a set of qualified commodity servers and disks. The ECS scale-out, geo-distributed architecture is a cloud platform that can provide at least the following features: (i) lower cost than public clouds; (ii) unmatched combination of storage efficiency and data access; (iii) anywhere read/write access with strong consistency that simplifies application development; (iv) no single point of failure to increase availability and performance; (v) universal accessibility that eliminates storage silos and inefficient extract, transform, load (ETL)/data movement processes; etc.

ECS employs a specific method for disk capacity management. ECS does not rely on a file system. Instead, all disk space in the ECS is partitioned into a set of blocks of fixed size (e.g., 128 MB) called chunks. User data is stored in these chunks and the chunks can be shared. In an example, one chunk can comprise data fragments of different user objects. Chunk content is modified in append-only mode. When a chunk becomes full enough, it is sealed. Content of sealed chunks is immutable.

Example systems and methods disclosed herein, in one or more embodiments, relate to geographically distributed (GEO) erasure coding, which inherits all the issues of GEO exclusive-or (XOR) except low scalability. ECS supports geographically distributed setups consisting of two or more zones. GEO can be used to provide an additional protection of user data by means of data replication. The data replication mechanism works at the chunks level. In some scenarios, ECS can utilize an XOR technique to minimize capacity overhead associated with GEO data protection. However, the XOR technique is not scalable. Use of GEO XOR enables a distributed storage to recover data from a failure of a single zone, cluster, or chunk in the distributed storage. However, GEO XOR cannot recover data from a dual failure or from more complicated failures.

In one aspect, the systems and methods disclosed herein relate to improving resource efficiency and gradualness of data re-protection with GEO Erasure Coding (GEO EC), which enables a geographically distributed storage to recover data from multiple (m) failures. Moreover, the systems and methods disclosed herein scale EC protection scheme for systems that use EC in a non-traditional manner. With the traditional use of EC, m coding fragments are produced for k data fragments of a single data portion. In contrast, with the EC disclosed herein, m coding portions are produced for k independent and/or unrelated data portions (e.g., independent data chunks). GEO EC is an example of such a non-traditional way to use of EC, where data and coding portions are data and coding chunks. The key features of the proposed method are with a new scheme. Although the systems and methods disclosed herein have been described with respect to object storage systems (e.g., ECS), it is noted that the subject specification is not limited to object storage systems and can be utilized for most any scale-out and/or scale-up geographically distributed storage systems that utilize EC (e.g., file storage systems).

Referring initially to FIG. 1, there illustrated is an example system 100 that facilitates data protection during expansion of a distributed cloud storage system, according to one or more aspects of the disclosed subject matter. In one aspect, the cloud storage system (e.g., ECS) can ensure durability, reliability, and/or availability of objects by creating and distributing multiple copies of objects and their metadata across the set of geographically separated zones 102 (e.g. that are located at different physical locations around the world). If one or more zones/sites experiences an outage/failure (e.g., including a dual failure or more complicated failure), data can be easily recovered based on encoded data stored at another zone/site.

Typically, a storage service layer can handle data availability and protection against data corruption, hardware failures, and/or data center disasters. A storage engine 104 can be a part of the storage services layer. As an example, the storage engine 104 can be a distributed shared service that runs on each node (e.g., within zones 102) and can manage transactions and persists data to the nodes. As an example, the storage engine 104 can enable global namespace management across geographically dispersed data centers through geo-replication. The geo-replication mechanism works at the chunks level. According to an aspect, the storage engine 104 can write all object-related data (such as, user data, metadata, and/or object location data) to logical containers of contiguous disk space known as chunks. Chunks are open and accepting writes, or closed and not accepting writes. After chunks are closed, the storage engine 104 erasure-codes the chunks.

During EC, the storage engine 104 can utilize a k+m protection scheme, wherein k represents the number of independent data chunks (wherein k can be most any integer) and m represents the number of coding chunks (wherein m can be most any integer). In one aspect, the storage engine 104 can encode the k data chunks (stored in different zones 102) to generate redundant m coding chunks. Moreover, the chunks are encoded in a manner such that the system can tolerate the loss of any m chunks. The m coding chunks can then be stored within different zones 102.

Normally, the greater the value for m, the higher the storage availability and durability. On the other hand, the greater the value for m, the higher the overhead on data protection. The overhead can be calculated as m/k. In order to keep the overhead reasonable, a greater m value can be compensated by greater k value. However, the greater sum k+m, the fewer the number of zone failures that can be endured by the cloud storage system. This number (n) can be calculated using the equation below.

$$n = \min\left(\left\lfloor \frac{m*N}{k+m} \right\rfloor, m\right) \quad (1)$$

Wherein N is the number of zones 102 in the GEO setup.

Thus, a protection scheme can be customized for a given distributed cloud storage system, which is described with the number or zones and/or their failure probabilities. Conventionally, cloud storage systems can scale-out while a protection scheme once chosen remains the same. For example, in an ECS, the number of zones may change from a half a dozen to a dozen. If a specific protection scheme is chosen for an initial/small GEO setup, oftentimes the scheme does not meet the requirements for a final/large GEO setup (and vice versa). Specifically, larger GEO setups allow higher capacity use efficiency since they allow greater k values. When a smaller value of k is chosen for a small GEO setup, the capacity use efficiency can be non-optimal after the GEO setup grows large. Alternatively, when a larger value of k is chosen for a large GEO setup the protection scheme does not meet requirements for the number of zone failures the cloud storage system can endure when the GEO setup is reduced.

Referring back to FIG. 1, a re-protection component 106 is utilized to scale the EC protection scheme as the distributed cloud storage system scales. Moreover, the re-protection component 106 can determine when zones are added to (and/or removed from) the system and can adjust the protection scheme (e.g., modify k and/or m values) to better suit (e.g., provide a higher capacity use efficiency, reduce capacity overhead, meet requirements for the minimum number of zone failures that can be endured, etc.) the new GEO setup.

According to one embodiment, the re-protection component 106 can read the all data chunks, and re-encode the data chunks, for example, using the adjusted protection scheme, to generate one or more new coding chunks that can replace the previously utilized coding chunks (e.g., the re-protection component 106 can delete the old coding chunks). This straightforward implementation can have the following challenges: (i) re-protection of all data just after a GEO setup expansion produces a substantial workload; (ii) old and new data chunks and new coding chunks are transferred over an inter-zone network, which can increase inter-zone network traffic; (iii) re-encoding of all data chunks causes high CPU utilization within a GEO setup.

The first challenge can be addressed by performing re-protection in the background with low intensity, such that overall GEO cloud storage system performance is not affected. According to another embodiment, to address the second and/or third challenges, the re-protection component 106 can alternatively, read only the newly added data chunks (e.g., within the newly added zones) and utilize the newly added data chunks to update the existing coding chunks. Accordingly, inter-zone network traffic and CPU utilization can be decreased. To generate coding chunks based on utilizing only the newly added data chunks, the re-protection component 106 can employ the below described coding matrices For a EC protection scheme k+m, a coding matrix m×k is used to generate m coding chunks from k data/chunks. Any sub-matrix m×l of the matrix m×k (l<k) is a proper coding matrix for a protection scheme l+m. For example, the following three example coding matrices CM1-CM3, for the protection schemes 10+2, 6+2, and 4+2, respectively, can share values of coefficients $X_{i,j}$ with the same i and j.

$$CM1 = \begin{vmatrix} X_{1,1} & X_{1,2} & X_{1,3} & X_{1,4} & X_{1,5} & X_{1,6} & X_{1,7} & X_{1,8} & X_{1,9} & X_{1,10} \\ X_{2,1} & X_{2,2} & X_{2,3} & X_{2,4} & X_{2,5} & X_{2,6} & X_{2,7} & X_{2,8} & X_{2,9} & X_{2,10} \end{vmatrix} \quad (2)$$

$$CM2 = \begin{vmatrix} X_{1,1} & X_{1,2} & X_{1,3} & X_{1,4} & X_{1,5} & X_{1,6} \\ X_{2,1} & X_{2,2} & X_{2,3} & X_{2,4} & X_{2,5} & X_{2,6} \end{vmatrix} \quad (3)$$

$$CM3 = \begin{vmatrix} X_{1,1} & X_{1,2} & X_{1,3} & X_{1,4} \\ X_{2,1} & X_{2,2} & X_{2,3} & X_{2,4} \end{vmatrix} \quad (4)$$

In an aspect, the re-protection component 106 can utilize the above described sub-matrices to scale with GEO EC, as follows. When a new GEO cloud storage system is being designed, one or more protection schemes are chosen with keeping in mind a potential system expansion in future. For example, a protection scheme 10+2 can be selected for a reasonably large GEO setup. In this example, the re-protection component 106 can select a 10+2 ($k_f$+m) as a potential final protection scheme for the cloud storage system and determine coefficients for the corresponding coding matrix (e.g., CM1). Further, the re-protection component 106 can select an initial protection scheme for the initial number of zones in the new GEO system ($N_1$). There are two known values: m (e.g., 2) and $N_1$ (6 in this example). Then, the initial $k_1$ can be calculated (e.g., by the re-protection component 106) using the equation $k_1 = N_1 - m$ (4 in this example) to assure data recovery after m zone failures. Accordingly, in this example, a $k_1$+m (e.g. 4+2) protection scheme is to be used for all new data while the GEO system keeps its initial size. The coding matrix m×$k_1$ to be used at the beginning is a sub-matrix of the coding matrix m×$k_f$ that has been chosen for the potential final protection scheme $k_f$+m.

When the GEO setup is expanded (e.g. 2 more zones get added to the system) a new protection scheme can be chosen (e.g., by the re-protection component 106) for the new number of zones ($N_2$=8). Further, $k_2$ can be calculated using the formula $k_2 = N_2 - m$ (6 in this example) to assure data recovery after m zone failures with higher capacity use efficiency. When the GEO system switches to the new protection scheme, all existing coding chunks are considered to be partial because the number of data chunks they combine is fewer than $k_2$ (4<6) and data chunks created by the new zones can be used to make the partial coding chunks complete again. The protection scheme can stop scaling after value of another $k_i$ reaches $k_f$ value.

In one example, system 100 can be part of most any object storage system such as, but not limited to, a Dell EMC® Elastic Cloud Storage (ECS™). It is noted that the zonez 102 can comprise one or more cluster of nodes that comprise volatile memory(s) or nonvolatile memory(s), or can comprise both volatile and nonvolatile memory(s). Examples of suitable types of volatile and non-volatile memory are described below with reference to FIG. 12. The memory (e.g., data stores, databases) of the subject systems and methods is intended to comprise, without being limited to, these and any other suitable types of memory. Although systems and methods disclosed describe a scale-out architecture, it is noted that the subject specification is not limited to scale-out architectures and can be applied to scale-up architecture as well.

Figure 2:
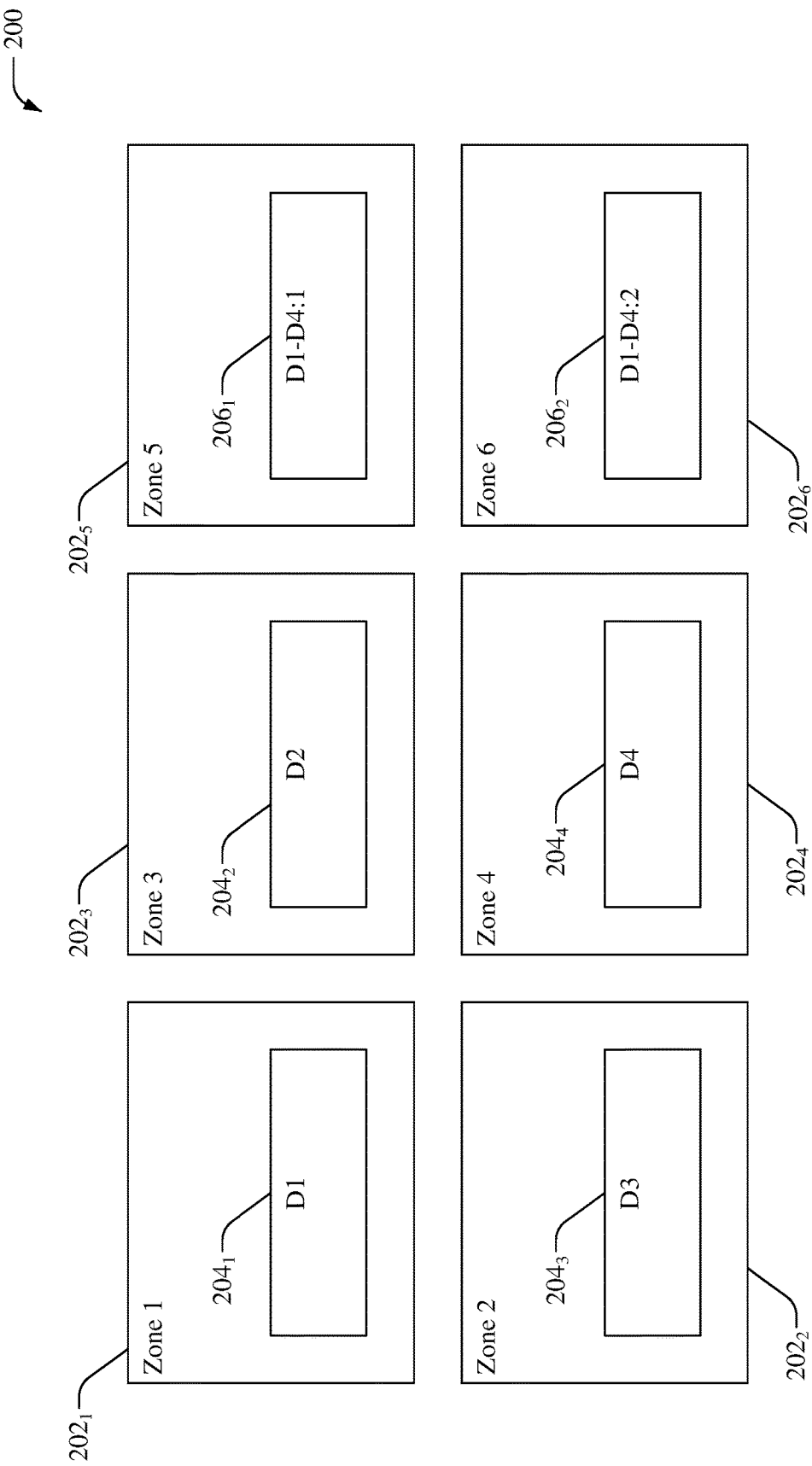
FIG. 2 illustrates an example system that has an initial geographically distributed (GEO) setup with protected data.

Referring now to FIGS. 2-5, there illustrated are example systems 200-500 that depict data re-protection when a GEO setup is scaled out, according to an aspect of the specification. Systems 200-500 depict an example scenario wherein an EC protection scheme is changed when zones are added to the GEO setup. However, it is noted that the subject specification is not limited to changing EC protection scheme when zones are added and that the EC protection scheme can be changed, based on the embodiments described herein, when one or more zones are removed. FIG. 2 illustrated an example system 200 having an initial configuration of six zones, Zone 1-Zone 6 ($202_1$-$202_6$). Typically, there is a requirement for the system 200 to be able to recover from two zone failures. As an example, it can be determined (e.g., by the re-protection component 106) that the system is to evolve and get six more zones in future. In this example scenario, the re-protection component 106 can select an EC protection scheme for the final/future configuration. For example, a 10+2 can be chosen as a potential final protection scheme. Further, the re-protection component 106 can select an EC protection scheme for an initial and/or intermediate configuration. For example, a 4+2 protection scheme can be selected as the initial protection scheme for the GEO setup of system 200, such that the system 200 can recover data even if any two of the zones fail (since m=2).

In one aspect, Zone 1($202_1$) comprises data chunk D1($204_1$), Zone 2($202_2$) comprises data chunk D2($204_2$), Zone 3($202_3$) comprises data chunk D3($204_3$), and Zone 4($202_4$) comprises data chunk D4($204_4$). Based on the initial protection scheme, the four data chunks chunk D1-D4 ($204_1$-$204_4$), are protected with two (complete) coding chunks D1-D4:1 ($206_1$) and D1-D4:2 ($206_2$). In an aspect, the two coding chunks, D1-D4:1 ($206_1$) and D1-D4:2 ($206_2$), are generated based on encoding the data chunks D1-D4 and are stored to Zone 5 ($202_5$) and Zone 6 ($202_6$) respectively. As an example, the encoding can be performed by utilizing a coding matrix that is a subset of a final coding matrix (e.g., that can be utilized for encoding a scaled-out version of the GEO setup). For example, the encoding operation can be represented with the equation below:

$$C_i = \sum_{j=1}^{k} C_{i,j} \quad (5)$$

wherein, $$C_{i,j} = X_{i,j} * D_j \quad (6)$$

and wherein, $X_{i,j}$ are defined coefficients from a coding matrix (e.g., from equations 2-4). Further, $D_j$ are independent data chunks (e.g., D1-D4 ($204_1$-$204_4$)) and $C_i$ are coding chunks (e.g., D1-D4:1 ($206_1$) and D1-D4:2 ($206_2$)). In this case, the overhead on data protection can be determined as 50% (m/k=2/4).

Figure 3:
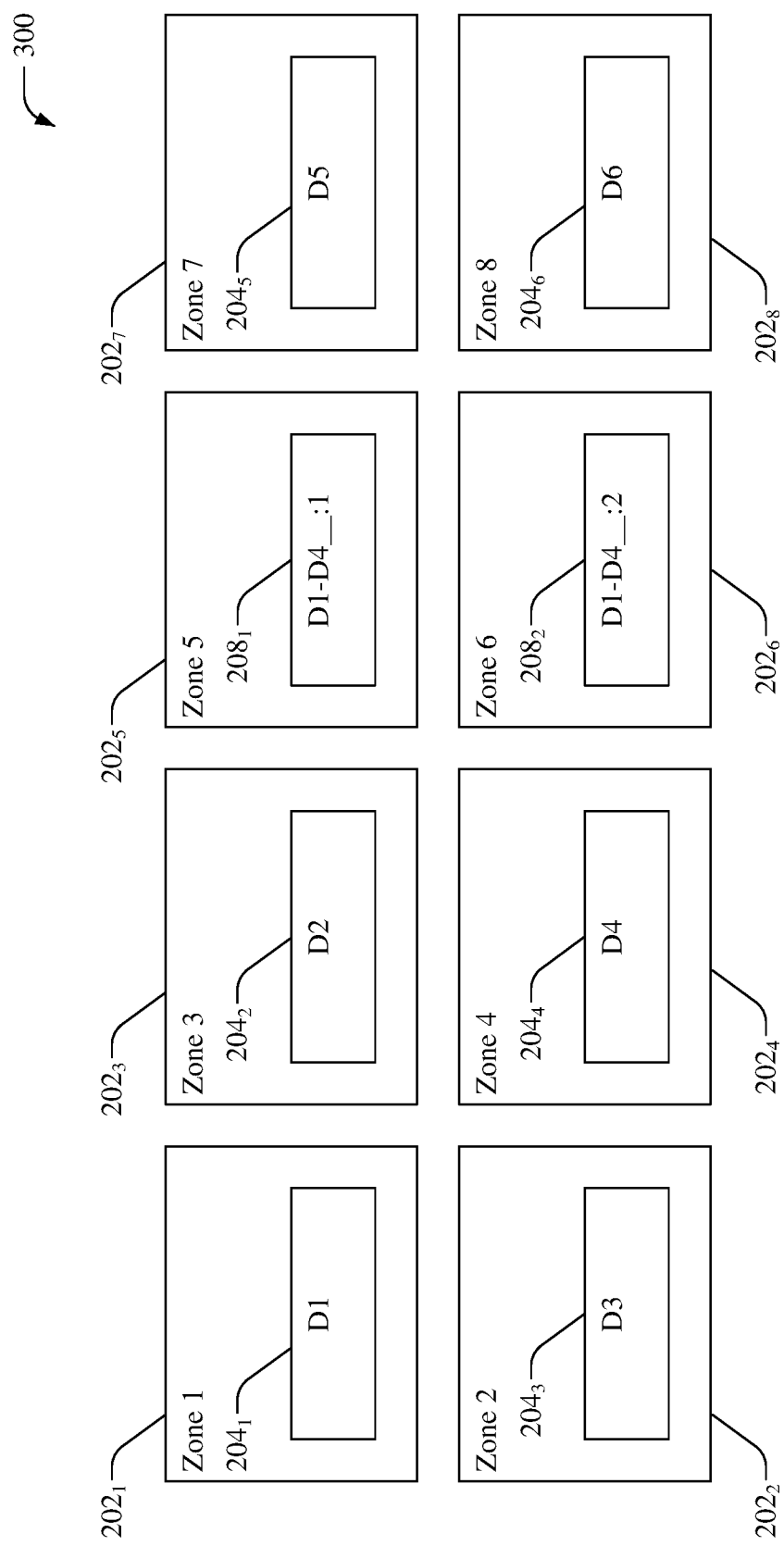
FIG. 3 illustrates an example system wherein the initial GEO setup has been expanded.

FIG. 3 depicts an example system 300, wherein the GEO setup of FIG. 2 has been expanded. In an example, two more zones, Zone 7-Zone 8 ($202_7$-$202_8$), are added to the system 200. Accordingly, it can be determined (e.g., by the re-protection component 106) to switch to the protection scheme from 4+2 to 6+2 to reduce capacity overhead on data protection. The overhead on data protection with the new scheme can be 33% (m/k=2/6). Note that use of the new 6+2 protection scheme cannot be utilized for the initial GEO setup (of system 200) because the cloud storage system would have not tolerated a dual zone failure with a 6+2 protection scheme. In one aspect, system 300 can switch to 6+2 protection scheme to get higher capacity use efficiency. On switching the protection scheme, the coding chunks (e.g., D1-D4:1 ($206_1$) and D1-D4:2 ($206_2$)) can be marked as partial and/or incomplete coding chunks D1-D4__:1 ($208_1$) and D1-D4__:2 ($208_2$) (that are now incomplete with respect to the new protection scheme). In one example, the Zone 7($202_7$) and Zone 8 ($202_8$) can create new data chunks D5 ($204_5$) and D6 ($204_6$), respectively.

Figure 4:
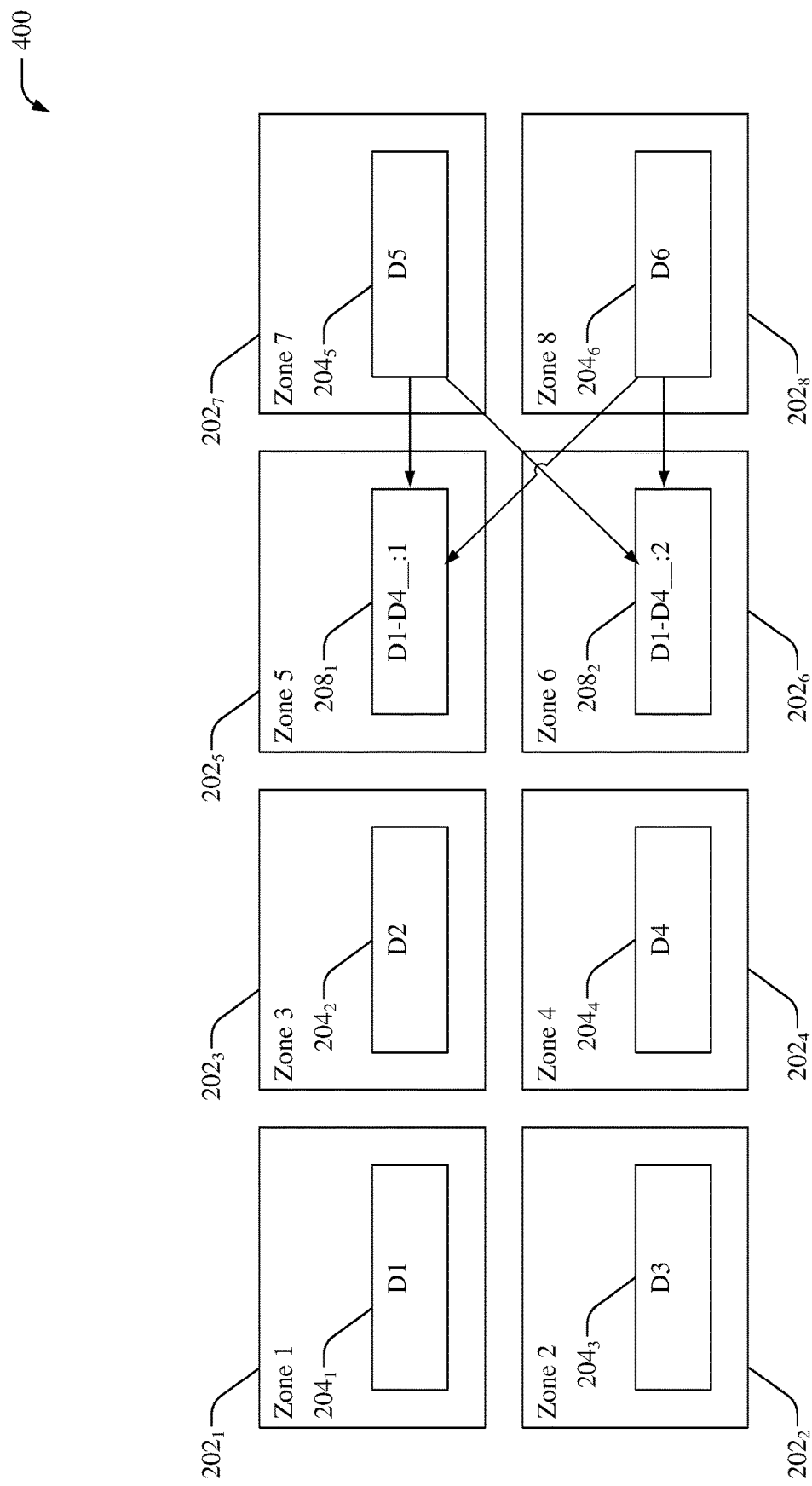
FIG. 4 illustrates an example system for replicating newly created data chunks within a scaled-out GEO setup.

FIG. 4 depicts an example system 400 for replicating the newly created data chunks. In one aspect, the new zones, Zone 7($202_7$) and Zone 8 ($202_8$), can replicate data chunks D5 ($204_5$) and D6 ($204_6$) to the zones (e.g., Zone 5 ($202_5$) and Zone 6 ($202_6$)) that comprise the partial coding chunks (e.g., D1-D4__:1 ($208_1$) and D1-D4__:2 ($208_2$)), for example, via an inter-zone network.

Figure 5:
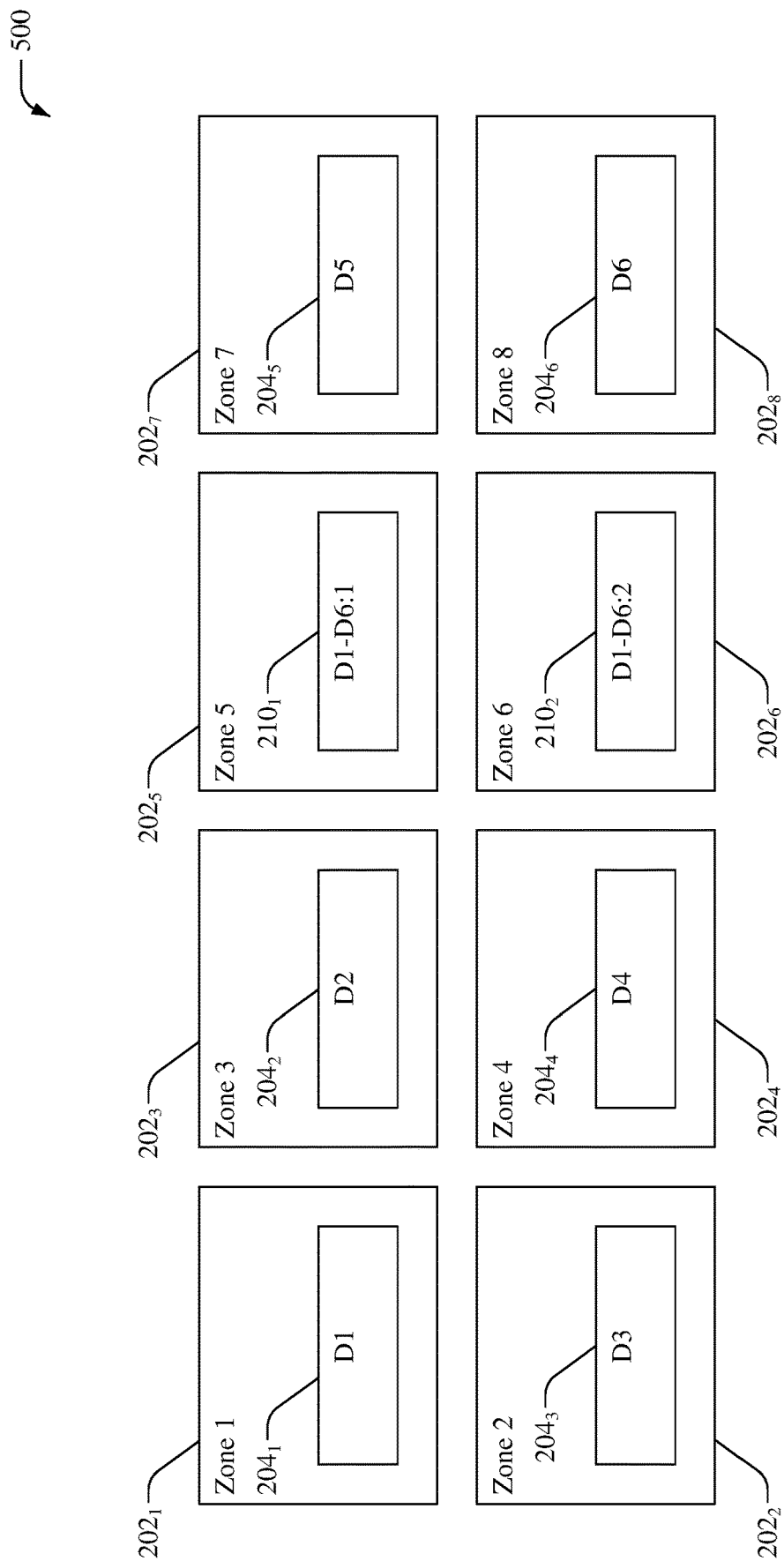
FIG. 5 illustrates an example system that has a final GEO setup with protected data.

FIG. 5 depicts an example system 500 that has an expanded GEO setup with six protected data chunks. As an example, the Zone 5 ($202_5$) and Zone 6 ($202_6$) can utilize the received data chunks to complete the encoding and generate complete coding chunks D1-6:1 ($210_1$) and D1-D6:2 ($210_2$) by combining the partial coding chunks (e.g., D1-D4:1 ($208_1$) and D1-D4_:2 ($208_2$)) with the received data. As an example, equations 5-6 can be utilized to generate the complete coding chunks D1-6:1 ($210_1$) and D1-D6:2 ($210_2$). Once the complete coding chunks D1-6:1 ($210_1$) and D1-D6:2 ($210_2$) are created, the Zone 5 ($202_5$) and Zone 6 ($202_6$) can delete the replicated data chunks D5 ($204_5$) and D6 ($204_6$) from their memory.

Since only two data chunks are transferred over the inter-zone network during re-protection (instead of retransmitting all six chunks again), inter-zone network is substantially reduced. Further, since only two data chunks are processed by the Zone 5 ($202_5$) and Zone 6 ($202_6$) during re-protection (instead of processing all six chunks again), the utilization of system resources (e.g., memory, CPU, etc.) can also be significantly reduced. The GEO EC technique disclosed herein assures an increased Total Cost of Ownership (TCO) per gigabyte (GB) in a geographically distributed cloud storage systems.

Figure 6:
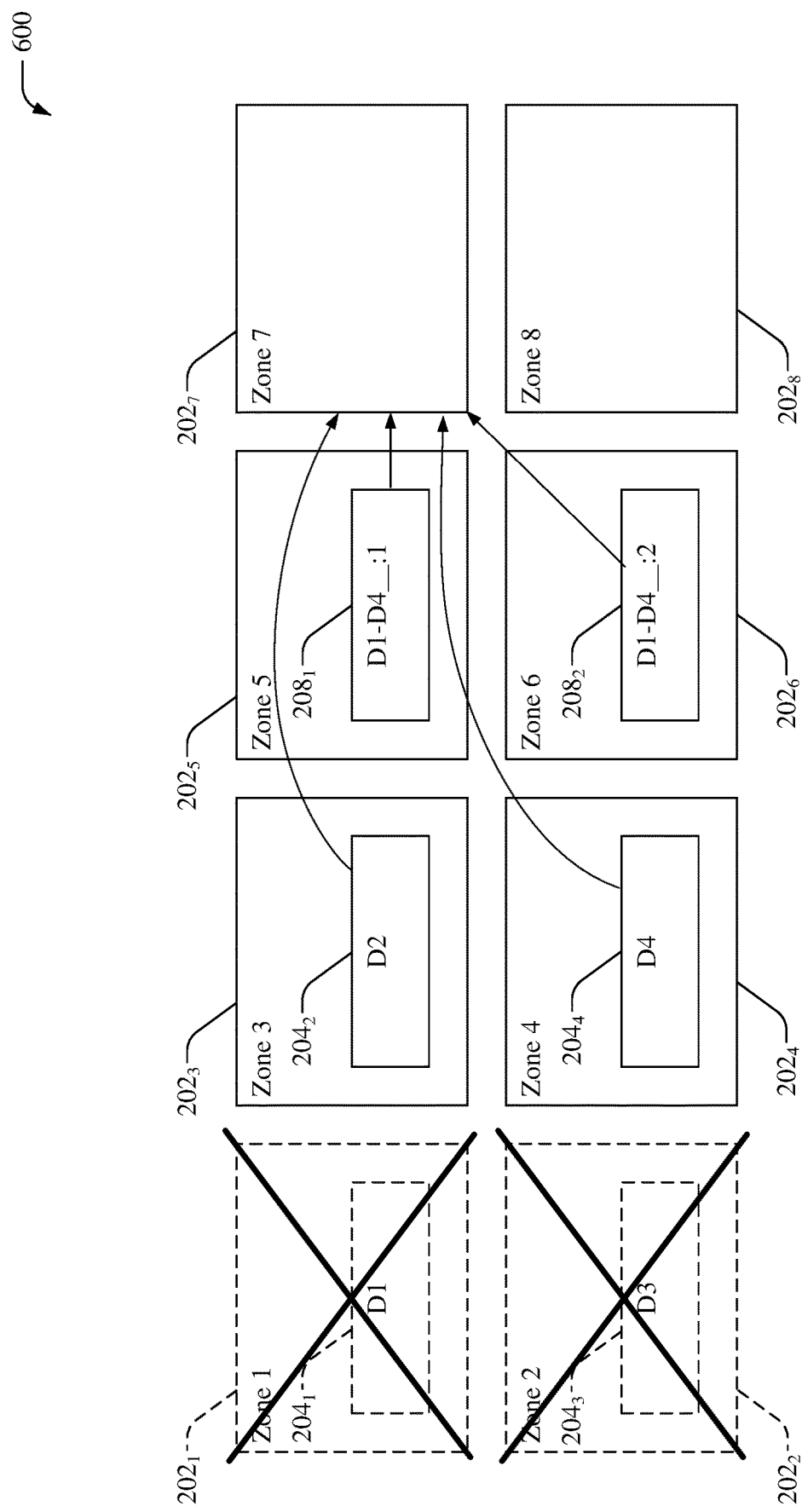
FIG. 6 illustrates an example system that depicts a dual-zone failure in a distributed storage system.

Referring now to FIG. 6, there illustrated is an example system 600 that depicts a two-zone failure in a distributed cloud storage system. As an example, Zone 1 ($202_1$) and Zone 3 ($202_3$) have failed and/or are unavailable as denoted by the crossed lines. On detecting the failure condition, the other available zones determine that the failures are permanent and stop attempts to communicate with the failed zones. Further, the available zones start recovery of data chunks (or coding chunks) that were stored within the failed zones. As depicted in system 600, the available zones can transfer a copy of their chunks to a designated zone, for example, Zone 7 ($202_7$).

Figure 7:
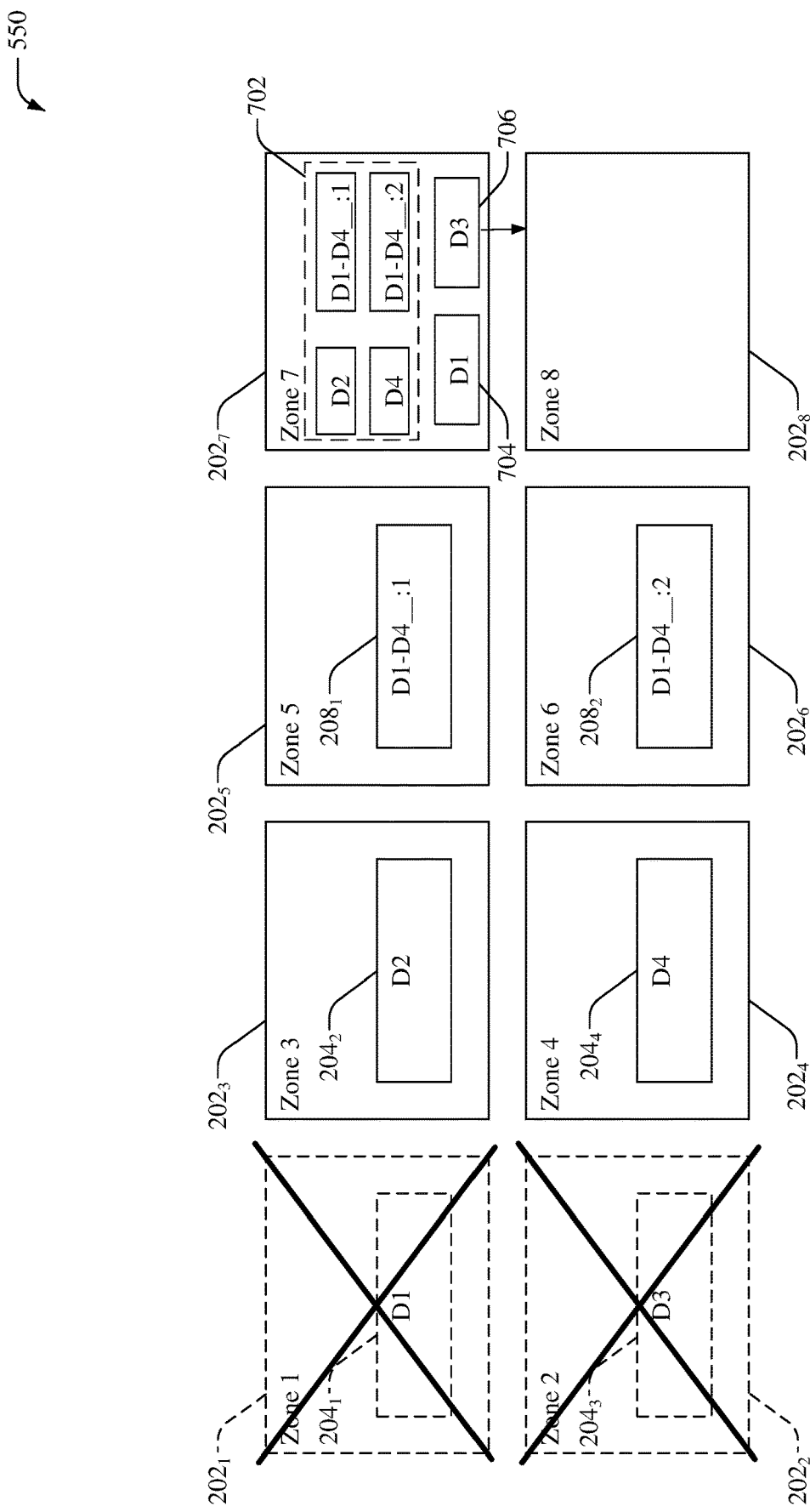
FIG. 7 illustrates an example system for decoding chunks to facilitate data chunk recovery in a GEO setup.

FIG. 7 illustrates an example system 700 for decoding to facilitate chunk recovery in a GEO setup. For example, Zone 7 ($202_7$) can utilize received data 702 to generate the lost data chunks D1 704 and D3 706. As an example, Zone 7

($202_7$) can combine the received data 702 with the coefficients of a defined decoding matrix associated with a EC protection scheme (e.g., 4+2 scheme) to recover the lost chunks.

Figure 8:
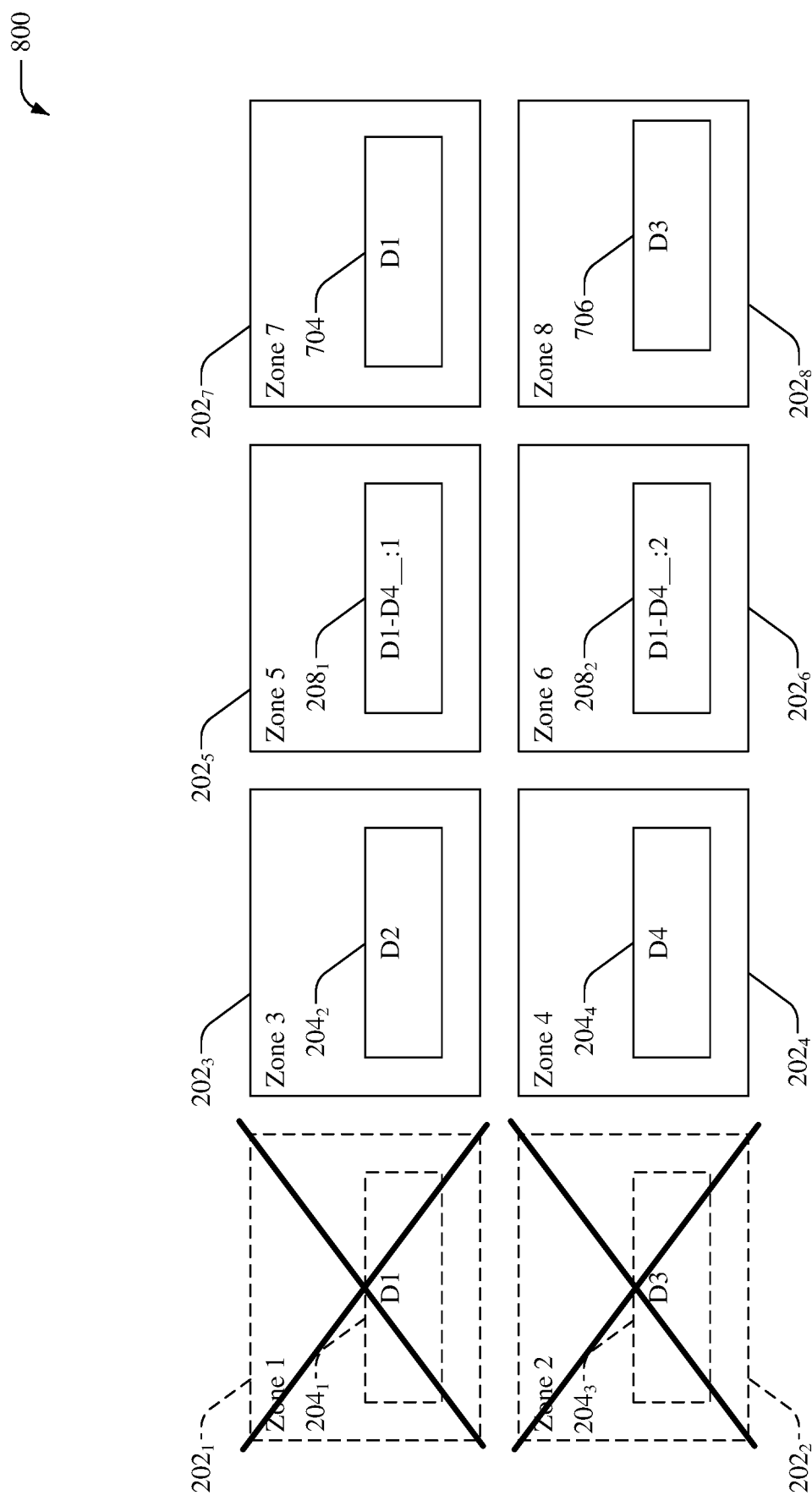
FIG. 8 illustrates an example system that depicts a final layout in a GEO setup after a decoding operation has been performed.

FIG. 8 illustrates an example system 800 that depicts a final layout in a GEO setup after a decoding operation has been performed. In one aspect, some of the recovered data chunks, for example, D3 706, can be moved to another zone, for example, Zone 8 ($202_8$). Further, Zone 7 ($202_7$) can delete the received data 702.

Figure 9:
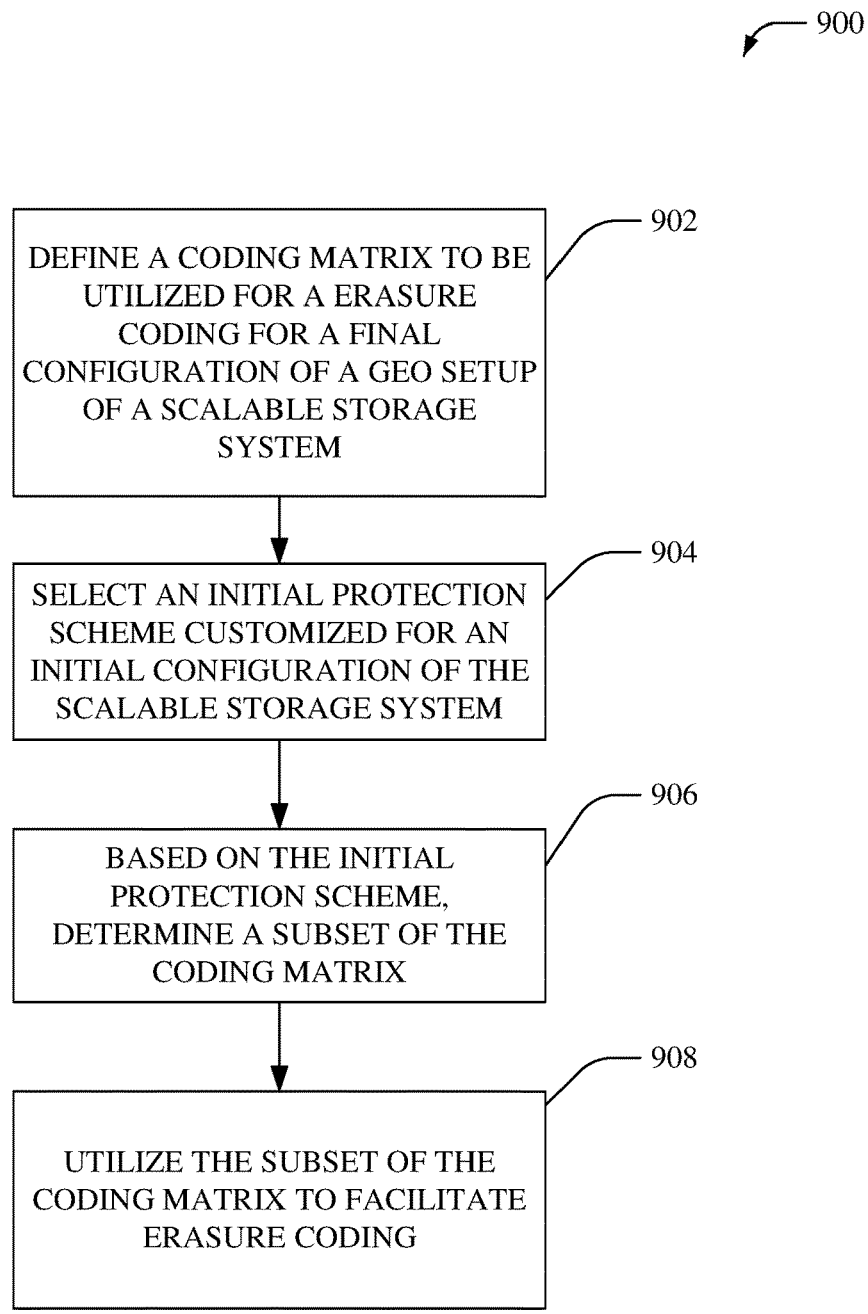
FIG. 9 illustrates an example method that facilitates erasure coding in a scale-out distributed storage system.
Figure 10:
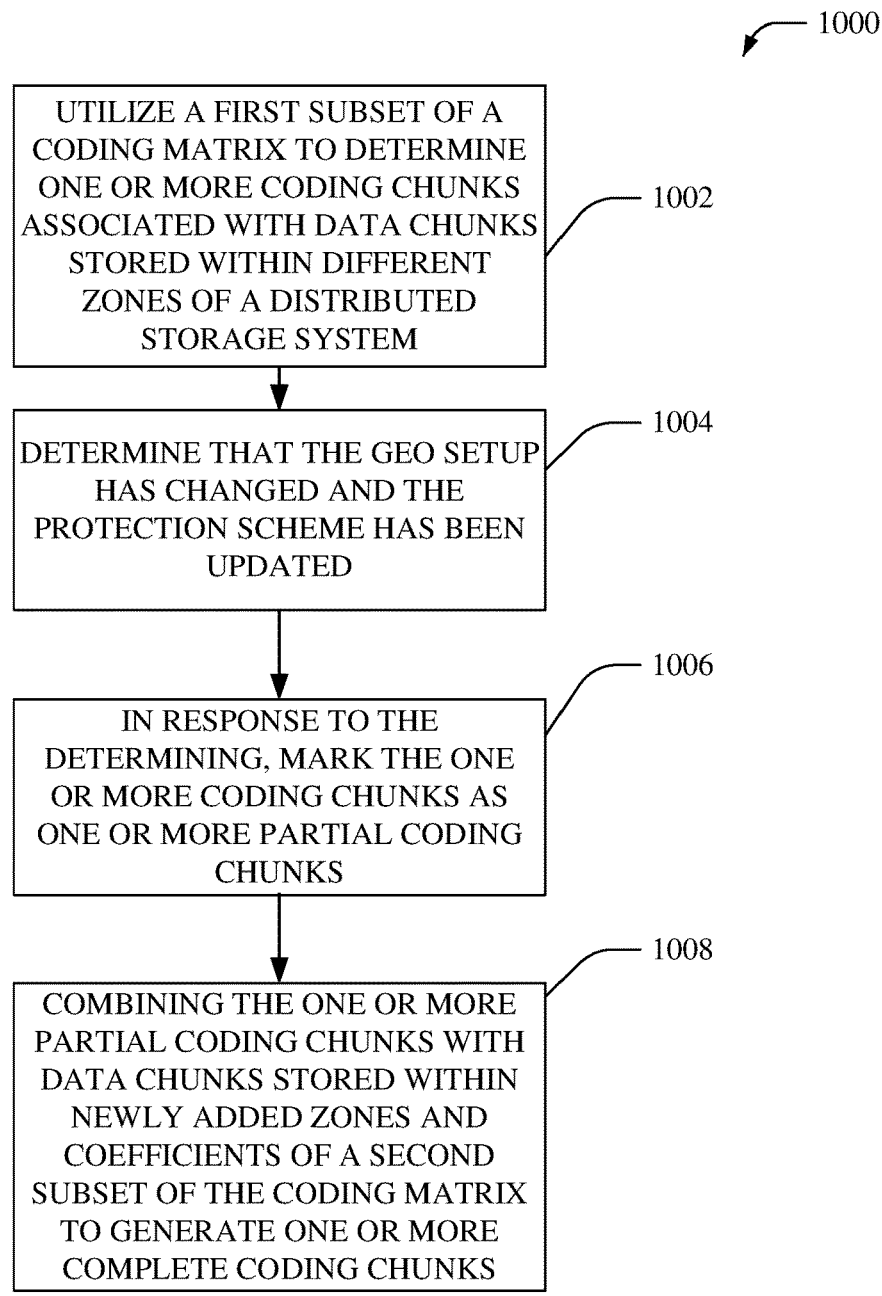
FIG. 10 illustrates an example method that facilitates scale-out distributed erasure coding.

FIGS. 9-10 illustrate flow diagrams and/or methods in accordance with the disclosed subject matter. For simplicity of explanation, the flow diagrams and/or methods are depicted and described as a series of acts. It is to be understood and appreciated that the various embodiments are not limited by the acts illustrated and/or by the order of acts, for example acts can occur in various orders and/or concurrently, and with other acts not presented and described herein. Furthermore, not all illustrated acts may be required to implement the flow diagrams and/or methods in accordance with the disclosed subject matter. In addition, those skilled in the art will understand and appreciate that the methods could alternatively be represented as a series of interrelated states via a state diagram or events. Additionally, it should be further appreciated that the methods disclosed hereinafter and throughout this specification are capable of being stored on an article of manufacture to facilitate transporting and transferring such methods to computers. The term article of manufacture, as used herein, is intended to encompass a computer program accessible from any computer-readable device or computer-readable storage/communications media.

Referring now to FIG. 9, there illustrated is an example method 900 that facilitates EC in a scale-out distributed cloud storage system, according to an aspect of the subject disclosure. In one aspect, method 900 can be implemented by one or more zones of a GEO object storage system. At 902, a coding matrix, that is to be utilized for EC a final configuration of a GEO setup of a scalable cloud storage system, can be defined. For example, the coding matrix can be defined based on a potential protection scheme that is to be used for the final configuration. At 904, an initial protection scheme that is customized for an initial configuration of the GEO setup can be selected. For example, the initial scheme can be chosen such that the scalable cloud storage system can provide a higher capacity use efficiency while satisfying tolerance criteria associated with the number of zone failures (e.g., two-zone failure) the cloud storage system can endure. At 906, based on the initial protection scheme, a subset of the coding matrix can be selected. Further, at 908, the subset of the coding matrix can be utilized to facilitate EC of the initial configuration of the GEO setup.

FIG. 10 illustrates an example method 1000 that facilitates scale-out distributed EC in a distributed cloud storage system, according to an aspect of the subject disclosure. According to an aspect, method 1000 can be implemented by one or more zones of the distributed cloud storage system. At 1002, a first subset of a coding matrix can be utilized to determine one or more coding chunks that are associated with data chunks stored within different zones of a distributed cloud storage system. At 1004, it can be determined that the GEO setup has changed (e.g., additional zones have been added to the GEO setup) and that the protection scheme has been updated (e.g., optimized for the new GEO setup). As an example, the value of k and/or m can be changed to provide a higher capacity use efficiency while satisfying tolerance criteria associated with the number of zone failures the cloud storage system can endure. At 1006, in response to the determination, the one or more coding chunks can be marked as partial coding chunks (e.g., partially coded with respect to the new GEO setup). Further, at 1008, the one or more partial coding chunks can be combined with data chunks stored within the newly added zones and coefficients of a second subset of the coding matrix to generate one or more complete coding chunks. Since only data chunks from the newly added zones are transferred over the inter-zone network during re-protection, inter-zone network can be substantially reduced. Further, since only data chunks from the newly added zones are processed during re-protection, the system resource utilization can also be significantly reduced.

Figure 11:
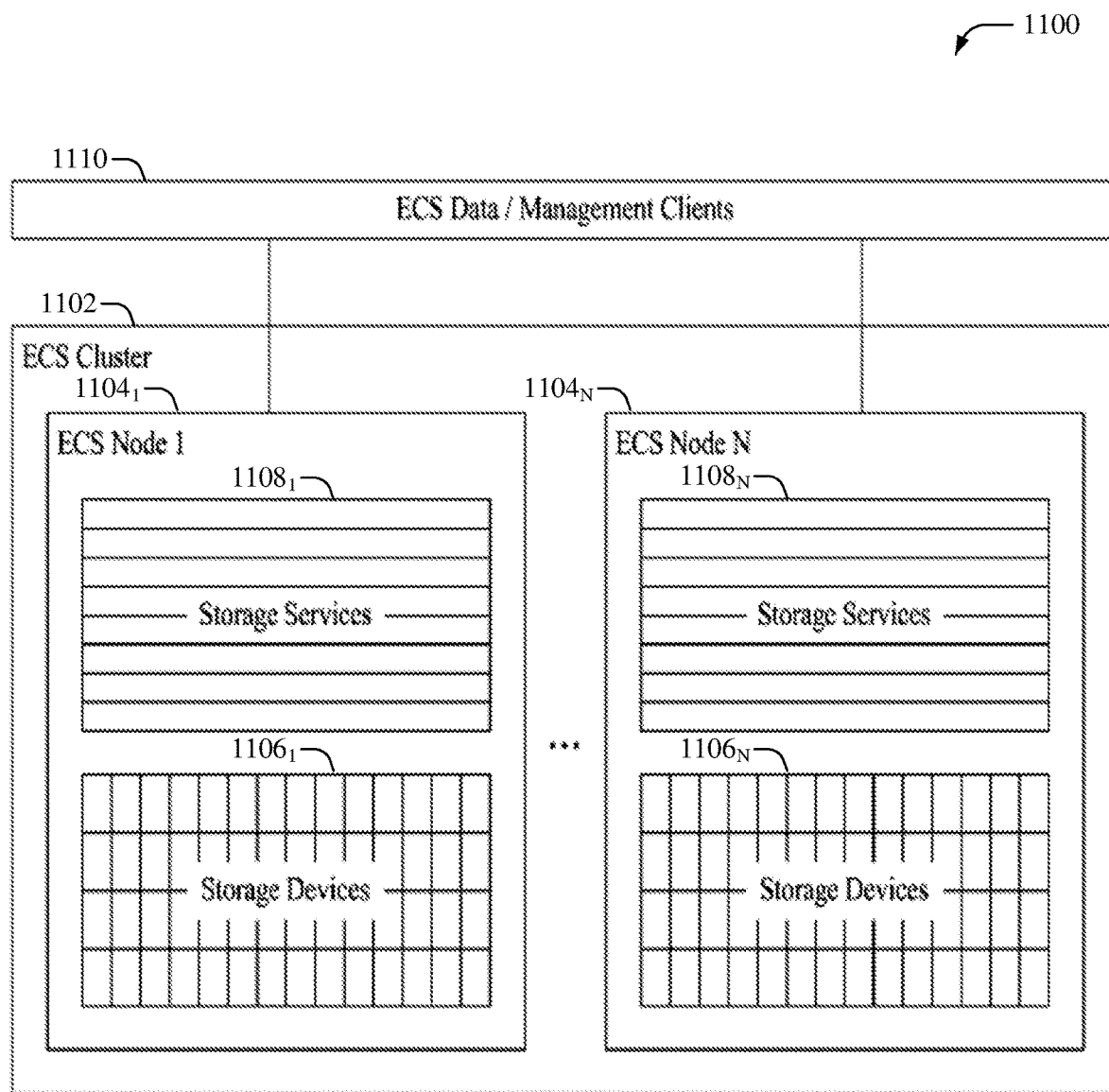
FIG. 11 illustrates high-level architecture of an Elastic Cloud Storage (ECS) cluster that employs scale-out distributed erasure coding.

FIG. 11 illustrates an example high-level architecture 1100 of an ECS cluster, according to an aspect of the subject disclosure. ECS can comprise a software-defined, cloud-scale, object storage platform that combines the cost advantages of commodity infrastructure with the reliability, availability and serviceability of traditional arrays. With ECS, an organization can deliver scalable and simple public cloud services with the reliability and control of a private-cloud infrastructure. ECS provides comprehensive protocol support for unstructured (object and/or file) workloads on a single, cloud-scale storage platform. In an aspect, the ECS cluster 1102 can comprise multiple nodes $1104_1$-$1104_N$, wherein N is most any integer. It is noted that in one or more non-limiting embodiments, the zones described herein (e.g., zones 102, Zone 1 ($202_1$)-Zone 8($202_8$)) and can include at least a portion of ECS cluster 1102. The nodes $1104_1$-$1104_N$ can comprise storage devices (e.g. hard drives) $1106_1$-$1106_N$ and can run a set of services $1108_1$-$1108_N$. For example, single node that runs ECS version 3.0 can manage 20 independent services. Further, ECS data/management clients 1110 can be coupled to the nodes $1104_1$-$1104_N$.

The ECS cluster 1102 does not protect user data with traditional schemes like mirroring or parity protection. Instead, the ECS cluster 1102 utilizes a k+m EC protection scheme, wherein a data block is divided into k data fragments and m coding fragments are created (e.g., by encoding the k data fragments). Encoding is performed in a manner such that the cluster 1102 can tolerate the loss of any m fragments.

Figure 12:
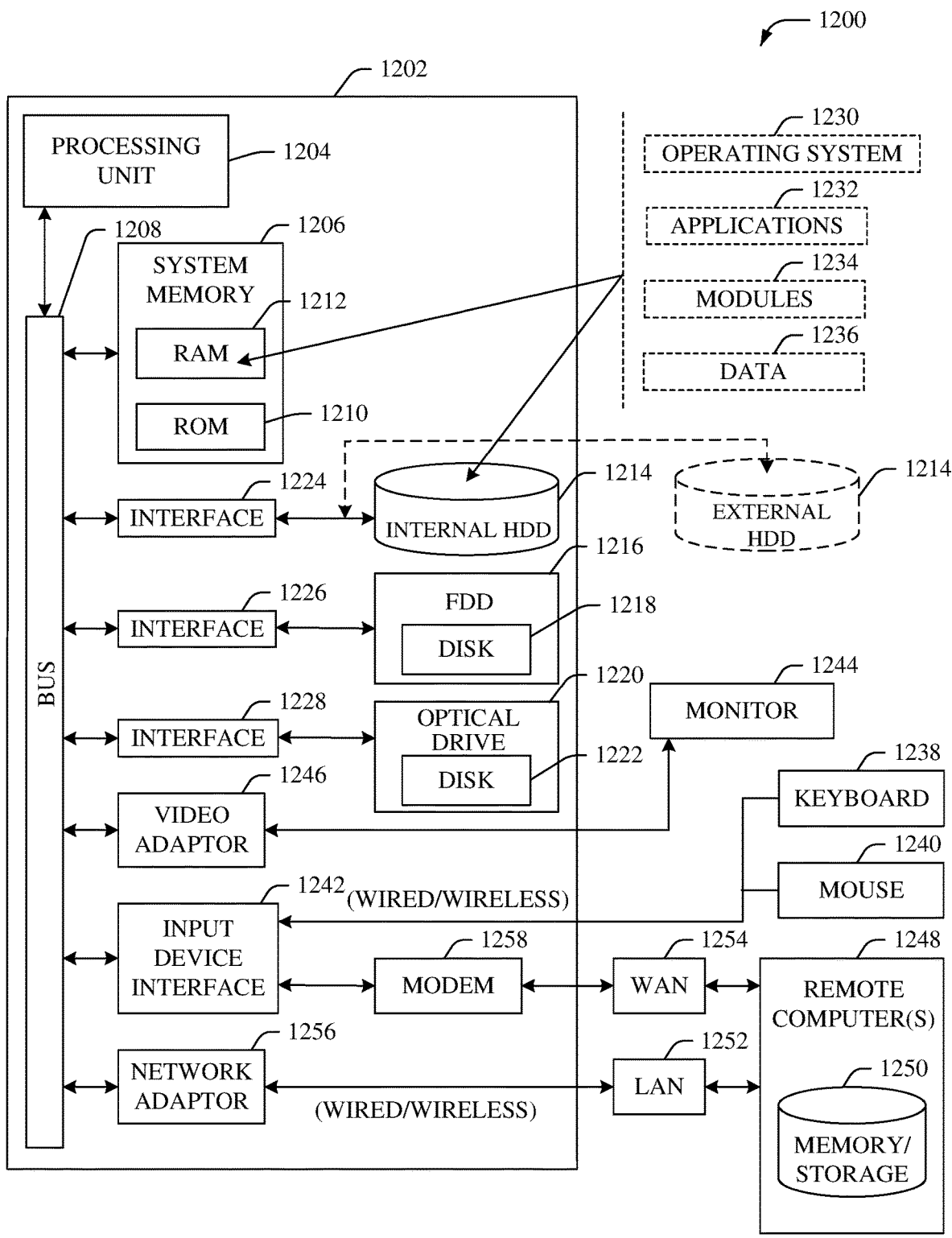
FIG. 12 illustrates a block diagram of an example computer operable to execute the disclosed distributed storage system architecture.

Referring now to FIG. 12, there is illustrated a block diagram of a computer 1202 operable to execute the disclosed storage architecture. In order to provide additional context for various aspects of the disclosed subject matter, FIG. 12 and the following discussion are intended to provide a brief, general description of a suitable computing environment 1200 in which the various aspects of the specification can be implemented. While the specification has been described above in the general context of computer-executable instructions that can run on one or more computers, those skilled in the art will recognize that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices. The illustrated aspects of the specification can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, radio frequency (RF), infrared and other wireless media.

With reference again to FIG. 12, the example environment 1200 for implementing various aspects of the specification includes a computer 1202, the computer 1202 including a processing unit 1204, a system memory 1206 and a system bus 1208. As an example, the component(s), server(s), node(s), cluster(s), system(s), driver(s), module(s), agent(s), engine(s), zone(s) and/or device(s) disclosed herein with respect to systems 100-800 can each include at least a portion of the computer 1202. The system bus 1208 couples system components including, but not limited to, the system memory 1206 to the processing unit 1204. The processing unit 1204 can be any of various commercially available processors. Dual microprocessors and other multi-processor architectures can also be employed as the processing unit 1204.

The system bus 1208 can be any of several types of bus structure that can further interconnect to a memory bus (with or without a memory controller), a peripheral bus, and a local bus using any of a variety of commercially available bus architectures. The system memory 1206 includes read-only memory (ROM) 1210 and random access memory (RAM) 1212. A basic input/output system (BIOS) is stored in a non-volatile memory 1210 such as ROM, EPROM, EEPROM, which BIOS contains the basic routines that help to transfer information between elements within the computer 1202, such as during startup. The RAM 1212 can also include a high-speed RAM such as static RAM for caching data.

The computer 1202 further includes an internal hard disk drive (HDD) 1214, which internal hard disk drive 1214 can also be configured for external use in a suitable chassis (not shown), a magnetic floppy disk drive (FDD) 1216, (e.g., to read from or write to a removable diskette 1218) and an optical disk drive 1220, (e.g., reading a CD-ROM disk 1222 or, to read from or write to other high capacity optical media such as the DVD). The hard disk drive 1214, magnetic disk drive 1216 and optical disk drive 1220 can be connected to the system bus 1208 by a hard disk drive interface 1224, a magnetic disk drive interface 1226 and an optical drive interface 1228, respectively. The interface 1224 for external drive implementations includes at least one or both of Universal Serial Bus (USB) and IEEE 1394 interface technologies. Other external drive connection technologies are within contemplation of the subject disclosure.

The drives and their associated computer-readable storage media provide nonvolatile storage of data, data structures, computer-executable instructions, and so forth. For the computer 1202, the drives and storage media accommodate the storage of any data in a suitable digital format. Although the description of computer-readable storage media above refers to a HDD, a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods of the specification.

A number of program modules can be stored in the drives and RAM 1212, including an operating system 1230, one or more application programs 1232, other program modules 1234 and program data 1236. All or portions of the operating system, applications, modules, and/or data can also be cached in the RAM 1212. It is noted that the specification can be implemented with various commercially available operating systems or combinations of operating systems.

A user can enter commands and information into the computer 1202 through one or more wired/wireless input devices, e.g., a keyboard 1238 and/or a pointing device, such as a mouse 1240 or a touchscreen or touchpad (not illustrated). These and other input devices are often connected to the processing unit 1204 through an input device interface 1242 that is coupled to the system bus 1208, but can be connected by other interfaces, such as a parallel port, an IEEE 1394 serial port, a game port, a USB port, an infrared (IR) interface, etc. A monitor 1244 or other type of display device is also connected to the system bus 1208 via an interface, such as a video adapter 1246.

The computer 1202 can operate in a networked environment using logical connections via wired and/or wireless communications to one or more remote computers, such as a remote computer(s) 1248. The remote computer(s) 1248 can be a workstation, a server computer, a router, a personal computer, portable computer, microprocessor-based entertainment appliance, a peer device or other common network node, and typically includes many or all of the elements described relative to the computer 1202, although, for purposes of brevity, only a memory/storage device 1250 is illustrated. The logical connections depicted include wired/wireless connectivity to a local area network (LAN) 1252 and/or larger networks, e.g., a wide area network (WAN) 1254. Such LAN and WAN networking environments are commonplace in offices and companies, and facilitate enterprise-wide computer networks, such as intranets, all of which can connect to a global communications network, e.g., the Internet.

When used in a LAN networking environment, the computer 1202 is connected to the local network 1252 through a wired and/or wireless communication network interface or adapter 1256. The adapter 1256 can facilitate wired or wireless communication to the LAN 1252, which can also include a wireless access point disposed thereon for communicating with the wireless adapter 1256.

When used in a WAN networking environment, the computer 1202 can include a modem 1258, or is connected to a communications server on the WAN 1254, or has other means for establishing communications over the WAN 1254, such as by way of the Internet. The modem 1258, which can be internal or external and a wired or wireless device, is connected to the system bus 1208 via the serial port interface 1242. In a networked environment, program modules depicted relative to the computer 1202, or portions thereof, can be stored in the remote memory/storage device 1250. It is noted that the network connections shown are example and other means of establishing a communications link between the computers can be used.

The computer 1202 is operable to communicate with any wireless devices or entities operatively disposed in wireless communication, e.g., desktop and/or portable computer, server, communications satellite, etc. This includes at least WiFi and Bluetooth® wireless technologies. Thus, the communication can be a predefined structure as with a conventional network or simply an ad hoc communication between at least two devices.

WiFi, or Wireless Fidelity, allows connection to the Internet from a couch at home, a bed in a hotel room, or a conference room at work, without wires. WiFi is a wireless technology similar to that used in a cell phone that enables such devices, e.g., computers, to send and receive data indoors and out; anywhere within the range of a base station. WiFi networks use radio technologies called IEEE 802.11 (a, b, g, n, etc.) to provide secure, reliable, fast wireless connectivity. A WiFi network can be used to connect computers to each other, to the Internet, and to wired networks (which use IEEE 802.3 or Ethernet). WiFi networks operate in the unlicensed 5 GHz radio band at a 54 Mbps (802.11a) data rate, and/or a 2.4 GHz radio band at an 11 Mbps (802.11b), a 54 Mbps (802.11g) data rate, or up to a 600 Mbps (802.11n) data rate for example, or with products that contain both bands (dual band), so the networks can provide real-world performance similar to the basic 10BaseT wired Ethernet networks used in many offices.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory in a single machine or multiple machines. Additionally, a processor can refer to an integrated circuit, a state machine, an application specific integrated circuit (ASIC), a digital signal processor (DSP), a programmable gate array (PGA) including a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units. One or more processors can be utilized in supporting a virtualized computing environment. The virtualized computing environment may support one or more virtual machines representing computers, servers, or other computing devices. In such virtualized virtual machines, components such as processors and storage devices may be virtualized or logically represented. In an aspect, when a processor executes instructions to perform "operations", this could include the processor performing the operations directly and/or facilitating, directing, or cooperating with another device or component to perform the operations In the subject specification, terms such as "data store," data storage," "database," "cache," and substantially any other information storage component relevant to operation and functionality of a component, refer to "memory components," or entities embodied in a "memory" or components comprising the memory. It is noted that the memory components, or computer-readable storage media, described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The illustrated aspects of the disclosure can be practiced in distributed computing environments where certain tasks are performed by remote processing devices that are linked through a communications network. In a distributed computing environment, program modules can be located in both local and remote memory storage devices.

The systems and processes described above can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders that are not all of which may be explicitly illustrated herein.

As used in this application, the terms "component," "module," "system," "interface," "cluster," "server," "node," or the like are generally intended to refer to a computer-related entity, either hardware, a combination of hardware and software, software, or software in execution or an entity related to an operational machine with one or more specific functionalities. For example, a component can be, but is not limited to being, a process running on a processor, a processor, an object, an executable, a thread of execution, computer-executable instruction(s), a program, and/or a computer. By way of illustration, both an application running on a controller and the controller can be a component. One or more components may reside within a process and/or thread of execution and a component may be localized on one computer and/or distributed between two or more computers. As another example, an interface can include input/output (I/O) components as well as associated processor, application, and/or API components.

Furthermore, the terms "user," "consumer," "client," and the like are employed interchangeably throughout the subject specification, unless context warrants particular distinction(s) among the terms. It is noted that such terms can refer to human entities or automated components/devices supported through artificial intelligence (e.g., a capacity to make inference based on complex mathematical formalisms), which can provide simulated vision, sound recognition and so forth.

Further, the various embodiments can be implemented as a method, apparatus, or article of manufacture using standard programming and/or engineering techniques to produce software, firmware, hardware, or any combination thereof to control a computer to implement one or more aspects of the disclosed subject matter. An article of manufacture can encompass a computer program accessible from any computer-readable device or computer-readable storage/communications media. For example, computer readable storage media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications can be made to this configuration without departing from the scope or spirit of the various embodiments.

In addition, the word "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
    a processor; and
    a memory that stores executable instructions that, when executed by the processor, facilitate performance of operations, comprising:
        determining a first coding matrix comprising a first erasure coding of first data chunks stored within a distributed storage system that comprises a plurality of zones, and first coding chunks that comprise an erasure coding of the first data chunks;
        determining that a first zone that comprises a second data chunk is added to the distributed storage system to produce a second distributed storage system;
        determining second coding chunks based on the second data chunk and the first coding chunks, the determining second coding chunks being performed independently of the first data chunks; and
        determining a second coding matrix for the second distributed storage system, the second coding matrix comprising the first coding chunks that are unmodified from the first coding matrix, and the second coding chunks, the second coding matrix comprising a second erasure coding of the first data chunks and the second data chunk.

2. The system of claim 1, wherein the first coding matrix is associated with a first erasure coding protection scheme used to encode the first data chunks, and wherein the operations further comprise:
    in response to determining that the first zone is added to the distributed storage system to produce the second distributed storage system, changing the first erasure coding protection scheme to a second erasure coding protection scheme used to encode the second data chunk of the second distributed storage system.

3. The system of claim 2, wherein a first capacity use efficiency provided by the first erasure coding protection scheme is less than a second capacity use efficiency provided by the second erasure coding protection scheme.

4. The system of claim 2, wherein the second erasure coding protection scheme is selected to satisfy a defined tolerance criterion associated with a number of zone failures determined to have been endured by the distributed storage system.

5. The system of claim 2, wherein the operations further comprise:
    in response to the determining that the distributed storage system has been expanded, determining that the first coding chunks of the first coding matrix are partial coding chunks.

6. The system of claim 5, wherein the operations further comprise:
    combining the partial coding chunks with the second data chunk to generate complete coding chunks.

7. The system of claim 6, wherein the dual zone failure is a first dual zone failure and the complete coding chunks are employable for recovery of at least one of the first data chunks or the second data chunk during a second dual zone failure.

8. The system of claim 6, wherein the combining comprises multiplying the second data chunk with a corresponding coefficient within the first coding matrix to generate modified data chunks and adding the modified data chunks to the partial coding chunks.

9. A method, comprising:
    determining, by a system comprising a processor, a first coding matrix comprising a first erasure coding of first data chunks stored within a distributed storage system comprising a first number of zones;

determining, by the system, that a first zone is added to the distributed storage system to produce a second distributed storage system, the first zone comprising a second data chunk;

determining, by the system, a second coding chunk for the second distributed storage system, the determining the second erasure coding being based on the first erasure coding and the second data chunk, the determining second coding chunks being performed independently of the first data chunks; and determining, by the system, a second coding matrix for the second distributed storage system, the second coding matrix comprising the first coding matrix, and the second coding chunk, the second coding matrix comprising a second erasure coding of the first data chunks and the second data chunk.

10. The method of claim 9, further comprising:

in response to the determining that the distributed storage system has been scaled out, assigning, by the system, first coding chunks of the first coding matrix as partial coding chunks.

11. The method of claim 10, further comprising:

combining, by the system, the partial coding chunks with the second data chunk to generate complete coding chunks.

12. The method of claim 11, wherein the dual zone failure is a first dual zone failure and the method further comprises:

based on the complete coding chunks, recovering, by the system, at least one of the first data chunks or the second data chunk during a second dual zone failure.

13. The method of claim 11, wherein the combining comprises:

multiplying, by the system, the second data chunks with corresponding coefficients within the second coding matrix to generate modified data chunks and adding the modified data chunks to the partial coding chunks.

14. The method of claim 9, wherein the determining the second coding matrix comprises:

multiplying, by the system, the first data chunks with corresponding coefficients within the first coding matrix to generate modified data chunks and adding the modified data chunks.

15. The method of claim 9, wherein the determining the second erasure coding is performed by a computing device, and the determining the second erasure coding is performed independently of transmitting the first data chunks to the computing device subsequent to a time at which the first erasure coding was determined.

16. A non-transitory computer-readable storage medium comprising instructions that, in response to execution, cause a system comprising a processor to perform operations, comprising:

determining a first coding matrix comprising a first erasure coding protection of first data chunks stored within a distributed storage system that comprises a plurality of zones;

determining that a first zone is added to the distributed storage system to produce a second distributed storage system, the first zone comprising a second data chunk; and determining a second coding matrix for the second distributed storage system, the second coding matrix comprising the first coding matrix that is unmodified, and a second coding chunk that is based on the first coding matrix and the second data chunk.

17. The computer-readable storage medium of claim 16, wherein the operations further comprise:

determining that at least one zone comprising at least one additional data chunk has been added to the distributed storage system resulting in the expanded version of the distributed storage system; and in response to the determining that the at least one zone has been added, categorizing first coding chunks of the first coding matrix as partial coding chunks.

18. The computer-readable storage medium of claim 17, wherein the operations further comprise:

based on combining the partial coding chunks with the at least one additional data chunk, generating complete coding chunks that are employable to recover at least one of the data chunks or the at least one additional data chunk during a dual zone failure.

19. The computer-readable storage medium of claim 18, wherein the portion is a first portion and the generating comprises generating the complete coding chunks based on a second portion of the coding matrix.

20. The computer-readable storage medium of claim 16, wherein a computing device separate from the plurality of zones determines the second erasure coding protection, and wherein the determining the second erasure coding protection is performed independently of sending the first data chunks to the computing device.

* * * * *